United States Patent
Abbasi

(10) Patent No.: US 11,923,835 B2
(45) Date of Patent: Mar. 5, 2024

(54) DRIVING MODULE

(71) Applicant: Key ASIC Inc., Hsinchu County (TW)

(72) Inventor: Shahbaz Abbasi, Hsinchu County (TW)

(73) Assignee: KEY ASIC INC., Hsinchu County (TW)

( * ) Notice: Subject to any disclaimer, the term of this patent is extended or adjusted under 35 U.S.C. 154(b) by 0 days.

(21) Appl. No.: 17/844,090

(22) Filed: Jun. 20, 2022

(65) Prior Publication Data

US 2023/0412166 A1    Dec. 21, 2023

(51) Int. Cl.
*H03K 17/00* (2006.01)
*H03K 17/16* (2006.01)
*H03K 17/687* (2006.01)

(52) U.S. Cl.
CPC ........... *H03K 17/16* (2013.01); *H03K 17/161* (2013.01); *H03K 17/687* (2013.01)

(58) Field of Classification Search
CPC ..... H03K 17/16; H03K 17/161; H03K 17/687
See application file for complete search history.

(56) References Cited

U.S. PATENT DOCUMENTS

| | | | | |
|---|---|---|---|---|
| 6,445,241 B2* | 9/2002 | Gabara | ............ | H03K 19/00361 327/518 |
| 8,508,261 B2* | 8/2013 | Li | ............ | H04L 25/03343 327/108 |
| 9,264,263 B2* | 2/2016 | Hafizi | ............ | H03K 5/12 |
| 9,350,395 B2* | 5/2016 | Martirosyan | ............ | H04B 1/40 |
| 9,590,595 B2* | 3/2017 | Luo | ............ | H04L 25/03076 |
| 11,031,936 B1 | 6/2021 | Luo et al. | | |
| 11,088,878 B2* | 8/2021 | Kim | ............ | H04L 25/4917 |
| 11,165,610 B1* | 11/2021 | Delshadpour | ............ | H04B 3/06 |
| 2008/0034378 A1* | 2/2008 | Kumar | ............ | G06F 13/4086 719/321 |
| 2012/0256661 A1 | 10/2012 | Li | | |
| 2013/0342242 A1 | 12/2013 | Hsieh | | |
| 2016/0197598 A1* | 7/2016 | Wu | ............ | H03K 19/017545 327/108 |
| 2016/0204768 A1 | 7/2016 | Luo et al. | | |

OTHER PUBLICATIONS

European Patent Office search report dated Jun. 13, 2023.

* cited by examiner

*Primary Examiner* — Tuan T Lam
(74) *Attorney, Agent, or Firm* — WPAT, P.C.

(57) ABSTRACT

A driving module including a voltage mode driver and a current mode driver is provided. The voltage mode driver converts a positive input signal to a positive output signal at a positive output terminal, and converts a negative input signal to a negative output signal at a negative output terminal. The current mode driver includes a first current source, a second current source, and a third current source. The first current source provides a first current to one of the positive output terminal and the negative output terminal. The second current source provides a second current to one of the positive output terminal and the negative output terminal. The third current source provides a third current to one of the positive output terminal and the negative output terminal.

19 Claims, 10 Drawing Sheets

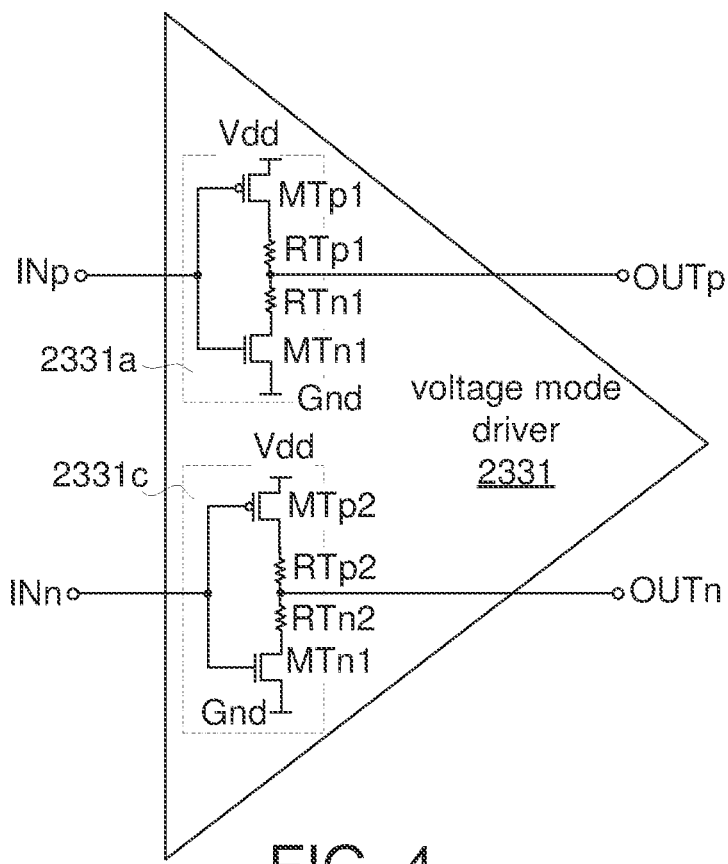
FIG. 4
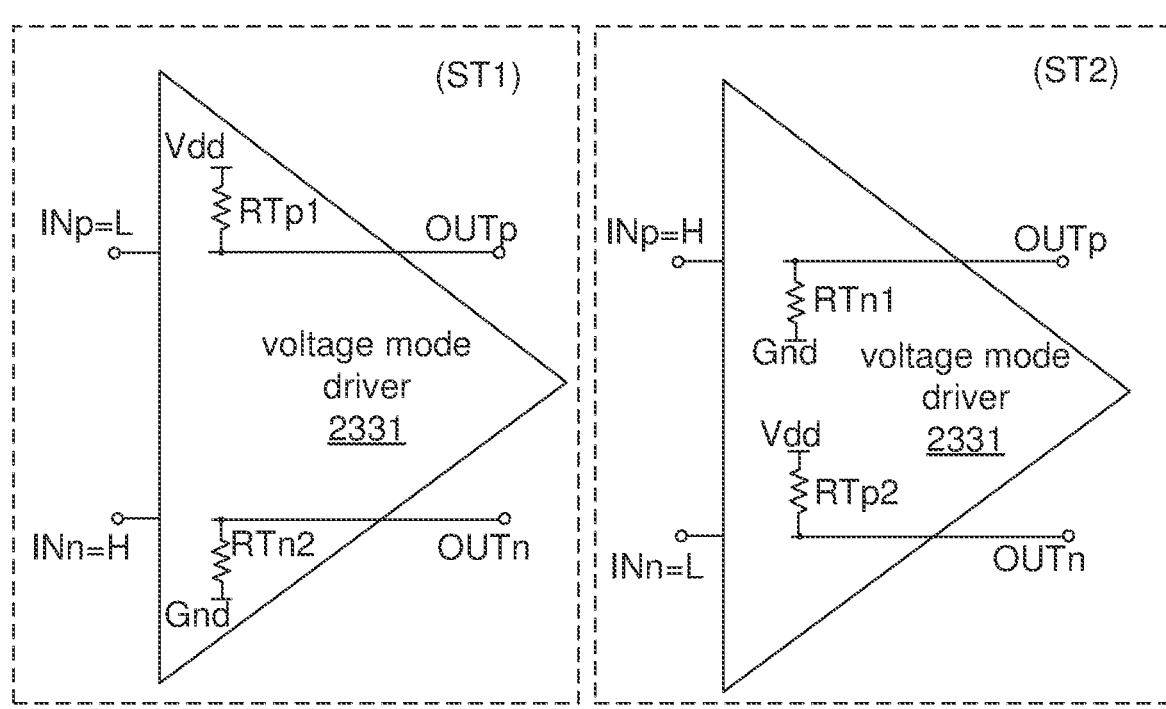
FIG. 5A
FIG. 5B

DRIVING MODULE

FIELD OF THE INVENTION

The present invention relates to a driving module, and more particularly to a driving module having a voltage mode driver and a current mode driver.

BACKGROUND OF THE INVENTION

More and more high-speed standards (for example, peripheral component interconnect express (hereinafter, PCIe), universal serial bus (hereinafter, USB), and double data rate (hereinafter, DDR) synchronous dynamic random-access memory (hereinafter, SDRAM) use serializer/deserializer (hereinafter, SERDES) interface for high-speed communication. As data communication rates continuously accelerate, criteria for high-speed systems become more and more critical.

FIG. 1 is a schematic diagram illustrating a high-speed system. A high-speed system 10 includes a transmitter (Tx) 11 and a receiver (Rx) 13. The transmitter (Tx) 11 sends a transmission signal to the receiver (Rx) 13, but the transmission signal degrades along the channel 15 due to a variety of reasons, including long transmission lines and jitter. Consequentially, a received signal actually received by the receiver (Rx) 13 is attenuated. Therefore, it is desired to eliminate the distortions to improve the signal quality.

SUMMARY OF THE INVENTION

The present invention relates to a driving module having a voltage mode driver and a current mode driver. Thus, the advantages of the voltage mode driver and the current mode driver are combined.

An embodiment of the present invention provides a driving module. The driving module includes a voltage mode driver and a current mode driver. The voltage mode driver is electrically connected to a positive output terminal and a negative output terminal. The voltage mode driver converts a positive input signal to a positive output signal at the positive output terminal and converts a negative input signal to a negative output signal at the negative output terminal. The positive input signal and the negative input signal are differential signals. The current mode driver is electrically connected to the voltage mode driver. The current mode driver includes a first current source, a second current source, and a third current source. The first current source provides a first current to one of the positive output terminal and the negative output terminal. The second current source provides a second current to one of the positive output terminal and the negative output terminal. The third current source provides a third current to one of the positive output terminal and the negative output terminal.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 4 is a schematic diagram illustrating an exemplary implementation of the voltage mode driver (vmDRV);

FIG. 5A is a schematic diagram illustrating state one (ST1) of the voltage mode driver (vmDRV);

FIG. 5B is a schematic diagram illustrating state two (ST2) of the voltage mode driver (vmDRV);

DETAILED DESCRIPTION OF PREFERRED EMBODIMENTS

To improve the signal quality, equalization is performed at the transmitter and the receiver. In the specification, a transmitter having pre-emphasis equalization to improve the quality of electrical signals transmitting at gigabit rates is provided.

The pre-emphasis equalization can be considered as an approach that slightly changes the pattern of the transmission signal before transmission. By doing so, the high-frequency content of the transmission signal is boosted, and/or the low-frequency content of the transmission signal is decreased.

With the pre-emphasis equalization, the side effects caused by the inter-symbol interference (hereinafter, ISI) are reduced, and the quality of the eye diagram of the received signal can be improved. In the specification, a feed-forward equalizer (hereinafter, FFE) is utilized to proceed with the pre-emphasis equalization, and the FFE includes a finite impulse response filter (hereinafter, FIR) having tap coefficients.

For illustration purposes, an exemplary 3-tap FIR filter incorporating a current mode driver (cmDRV) is illustrated below. With the 3-tap FIR filter, three consecutive pulses are multiplied with their respective coefficients ($C_{-1}$, $C_0$, $C_{+1}$) and added to generate the filter output. The tap coefficient $C_{-1}$ is the precursor, the tap coefficient $C_0$ is the cursor, and the tap coefficient $C_{+1}$ is the postcursor. It is assumed that the current mode driver (cmDRV) has three current sources $SRC_{C-1}$, $SRC_{C0}$, $SRC_{C+1}$, respectively corresponding to the tap coefficients $C_{-1}$, $C_0$, $C_{+1}$ of the 3-tap FIR filter. In practical applications, the number of tap coefficients and bit-lengths of the tap coefficients are not limited.

Table 1 summarizes some patterns of the voltage levels of the transmission signal for pre-emphasis equalization.

TABLE 1

| voltage levels of transmission signal for pre-emphasis equalization | corresponding condition |
| --- | --- |
| de-emphasis voltage (Va) | A boost appears just after the polarity inversion. |
| flat-level voltage (Vb) | A constant voltage will appear when bits of the same polarity are being transmitted. |
| pre-shoot voltage (Vc) | A boost appears just before the polarity inversion. |
| maximum boost voltage (Vd) | A major boost appears when there is polarity inversion only for a one-bit interval. |

Figure 1:
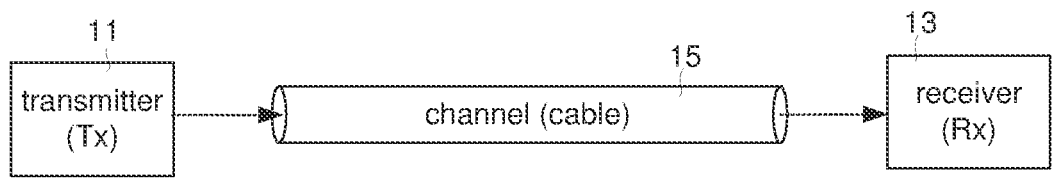
FIG. 1 (prior art) is a schematic diagram illustrating a high-speed system.
Figure 2:
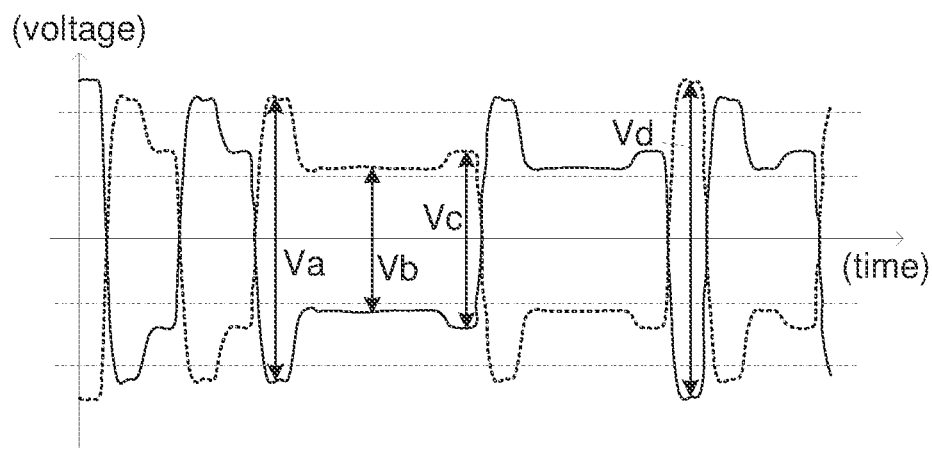
FIG. 2 is a schematic diagram illustrating an exemplary output signal of a transmitter.

FIG. 2 is a schematic diagram illustrating an exemplary transmission signal of a transmitter having a 3-tap FIR filter. The tap coefficients of the 3-tap FIR filter are set to generate the transmission signal with the proper amounts of de-emphasis and the pre-shoot to distort the transmission signal in advance so that the distortion introduced by the channel can be canceled. Table 2 summarizes definitions corresponding to different values of the transmission signal in FIG. 2.

TABLE 2

| waveform | definition |
| --- | --- |
| de-emphasis | $20*\log_{10} Vb/Va$ |
| pre-shoot | $20*\log_{10} Vc/Vb$ |
| boost | $20*\log_{10} Vd/Vb$ |

Please refer to FIG. 2 and Tables 1 and 2 together. A de-emphasized waveform (de-emphasis=$20*\log_{10} Vb/Va$) is defined in terms of the de-emphasis voltage Va and the flat-level voltage Vb. A pre-shoot waveform (pre-shoot=$20*\log_{10} Vc/Vb$) is defined in terms of the pre-shoot voltage Vc and the flat-level voltage Vb. A boost waveform (boost=$20*\log_{10} Vd/Vb$) is defined in terms of the maximum boost voltage Vd and the flat-level voltage Vb. Relationships between the tap coefficients and these voltage levels (de-emphasis voltage Va, the flat-level voltage Vb, the pre-shoot voltage Vc, and the maximum boost voltage Vd) can be referred to SERDES specifications.

Setting tap coefficients in SERDES requires careful consideration to ensure that the SERDES meets the electrical standard specifications while not compromising area and power consumption. To meet such criteria, a physical driving module integrating a voltage mode driver (vmDRV) and a current mode driver (cmDRV) is provided. Embodiments about the physical driving module are illustrated below.

In the specification, a terminal and the signal at the terminal are represented by the same symbol. For example, Vdd represents both the supply voltage and the supply voltage terminal.

Figure 3A:
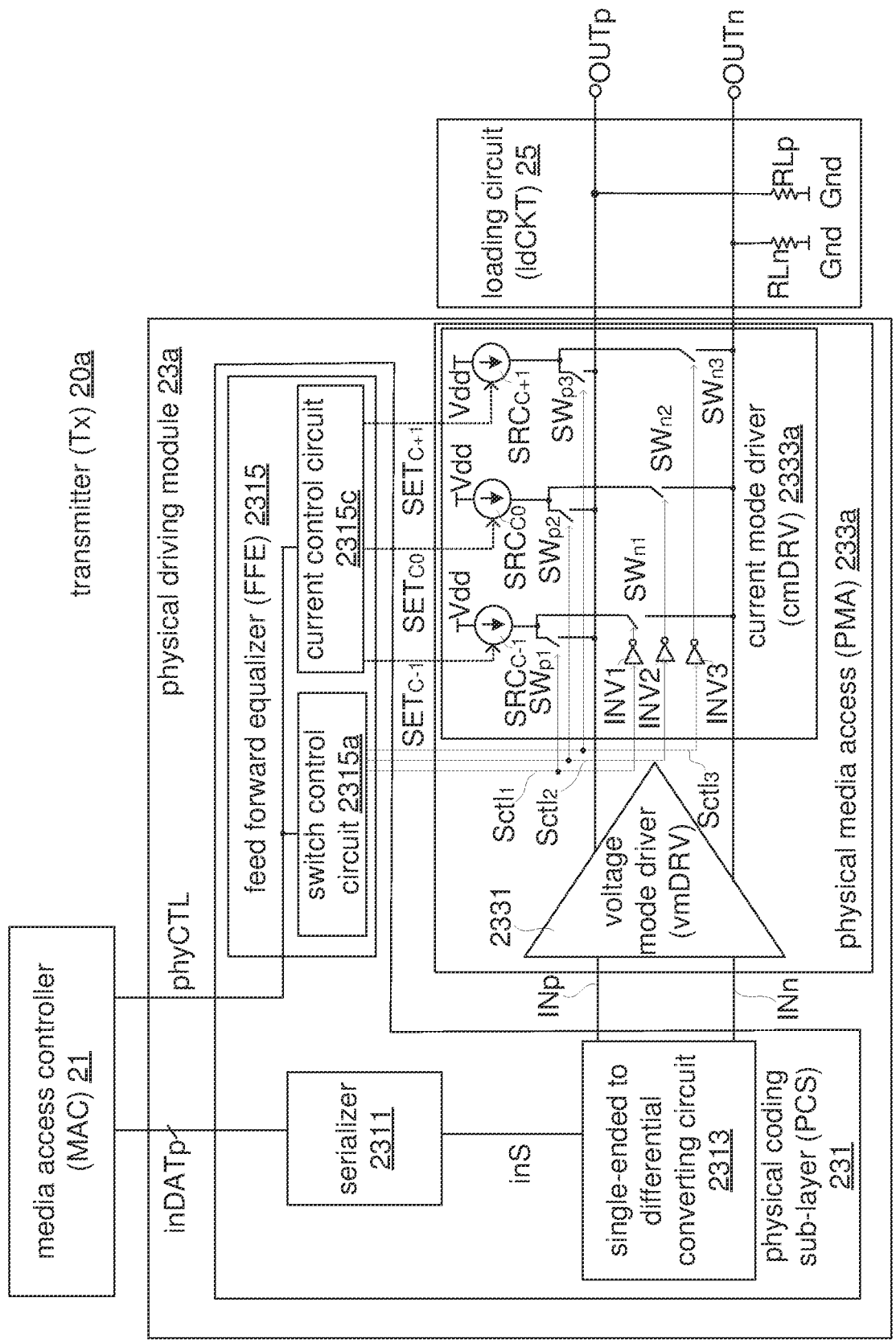
FIGS. 3A and 3B are schematic diagrams illustrating embodiments of the transmitter using a combination of a voltage mode driver and a current mode driver according to the embodiment of the present disclosure.
Figure 3B:
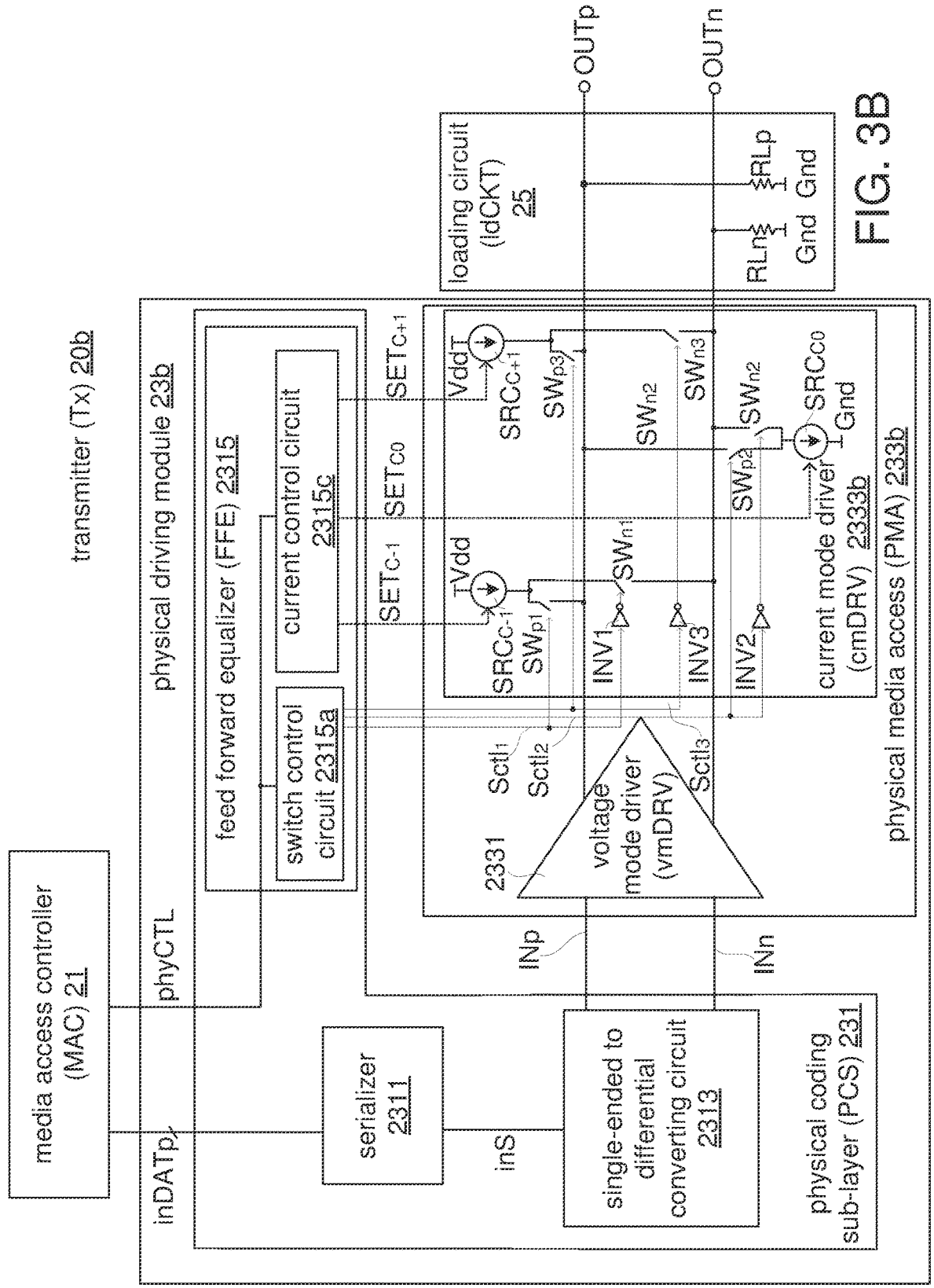

FIGS. 3A and 3B are schematic diagrams illustrating embodiments of the physical driving module adopted in the transmitter according to the embodiment of the present disclosure. The generic components of the transmitters 20a, 20b are similar. The transmitter (Tx) 20a, 20b includes a media access controller (hereinafter, MAC) 21, a physical driving module 23a, 23b, and a loading circuit (ldCKT) 25. The physical driving module 23a, 23b further includes a physical coding sub-layer (hereinafter, PCS) 231 and a physical media access (hereinafter, PMA) 233a, 233b. For the sake of illustration, the physical driving module 23a, 23b is assumed to have a one-lane scheme. In practical applications, the physical driving module 23a, 23b might have a multi-lane scheme.

The MAC 21 generates parallel input data inDATp and at least one physical control signal phyCTL. The parallel input data inDATp is transmitted to the serializer 2311, and the physical control signal phyCTL is transmitted to the PCS 231. As the MAC 21 involves different aspects of operations such as the upper-layer data acquirement, communication protocol, header adding, status information, and so forth, details about how the MAC 21 generates the parallel input data inDATp and the physical control signal are omitted.

The PCS 231 can be implemented with digital circuits, and the PMA 233a, 233b can be implemented with analog circuits. The PMA 233a, 233b receives settings or configurations from the PCS 231, wherein the settings or configurations are related to specifications of different standards. The PCS 231 includes a serializer 2311, a single-ended to differential converting circuit 2313, and a feed-forward equalizer (hereinafter, FFE) 2315. The serializer 2311 and the FFE 2315 are electrically connected to the MAC 21.

The serializer 2311 and the FFE 2315 respectively receive the parallel input data inDATp and the physical control signal phyCTL from the MAC 21. The serializer 201 transforms parallel input data inDATp to a sequence of input bits inS. The FFE 2315 further includes a switch control circuit 2315a and a current control circuit 2315c.

For the FFE 2315, the physical control signal phyCTL received from the MAC 21 carries the tap coefficients $C_{-1}$, $C_0$, $C_{+1}$. The MAC 21 determines the optimum tap coefficients $C_{-1}$, $C_0$, $C_{+1}$ in a link training procedure, depending on the handshake protocols of standards. Details about acquiring the tap coefficients $C_{-1}$, $C_0$, $C_{+1}$ are omitted in the specification.

The single-ended to differential converting circuit 2313 is electrically connected to the serializer 2311 and the PMA 233a. The single-ended to differential converting circuit 2313 converts the input bit inS to an input differential signal pair, including a positive input signal INp and a negative input signal INn.

When the input bit inS is logic high (H), the positive input signal INp is set to a positive voltage (signal high), and the negative input signal INn is set to a negative voltage (signal low). When the input bit inS is logic low (L), the positive input signal INp is set to a negative voltage (signal low), and the negative input signal INn is set to a positive voltage (signal high).

The PMA 233a, 233b includes a voltage mode driver (vmDRV) 2331 and a current mode driver (cmDRV) 2333a, 2333b. The voltage mode driver (vmDRV) 2331 is electrically connected to the single-ended to differential converting circuit 2313 and the current mode driver (cmDRV) 2333a, 2333b. The current mode driver (cmDRV) 2333a, 2333b is electrically connected to the loading circuit (ldCKT) 25, the switch control circuit 2315a, and the current control circuit 2315c.

The voltage mode driver (vmDRV) 2331 receives the positive input signal INp, and the negative input signal INn from the single-ended to differential converting circuit 2313 and generates a positive output signal OUTp and a negative output signal OUTn accordingly. Thus, the positive output signal OUTp and the negative output signal OUTn are dynamically changed in response to the positive input signal INp and the negative input signal INn.

The switch control circuit 2315a and the current control circuit 2315c receive the physical control signal phyCTL from the MAC 21. Based on the physical control signal phyCTL, the switch control circuit 2315a generates switch control signal $Sctl_1$, $Sctl_2$, $Sctl_3$ to the current mode driver (cmDRV) 2333a, 2333b, and the current control circuit 2315c generates current setting signals $SET_{C-1}$, $SET_{C0}$, $SET_{C+1}$ to the current mode driver (cmDRV) 2333a, 2333b. The switch control signal $Sctl_1$ corresponds to switches $SW_{p1}$, $SW_{n1}$, the switch control signal $Sctl_2$ corresponds to switches $SW_{p2}$, $SW_{n2}$, and the switch control signal $Sctl_3$ corresponds to switches $SW_{p3}$, $SW_{n3}$. The current setting signals $SET_{C-1}$, $SET_{C0}$, $SET_{C+1}$ respectively correspond to the tap coefficients $C_{-1}$, $C_0$, $C_{+1}$.

In FIG. 3A, the current mode driver (cmDRV) 2333a includes current sources $SRC_{C-1}$, $SRC_{C0}$, $SRC_{C+1}$, inverters INV1, INV2, INV3, and switches $SW_{p1}$, $SW_{n1}$, $SW_{p2}$, $SW_{n2}$, $SW_{p3}$, $SW_{n3}$. The current sources $SRC_{C-1}$, $SRC_{C0}$, $SRC_{C+1}$ are electrically connected to the supply voltage terminal Vdd and the current control circuit 2315c.

The switches $SW_{p1}$, $SW_{p2}$, $SW_{p3}$ are electrically connected to the positive output signal OUTp, and the switches $SW_{n1}$, $SW_{n2}$, $SW_{n3}$ are electrically connected to the negative output signal OUTn. The inverters INV1, INV2, INV3 are electrically connected to the switch control circuit 2315a, and the inverters INV1, INV2, INV3 respectively correspond to the switches $SW_{n1}$, $SW_{n2}$, $SW_{n3}$. The inverters INV1, INV2, INV3 respectively receive switch control signals $Sctl_1$, $Sctl_2$, $Sctl_3$ and generate signals complement to the switch control signals $Sctl_1$, $Sctl_2$, $Sctl_3$ at their outputs.

In FIG. 3A, the current sources $SRC_{C-1}$, $SR_{C0}$, $SRC_{C+1}$ respectively provide source currents $I_{C-1}$, $I_{C0}$, $I_{C+1}$. The current values of the source currents $I_{C-1}$, $I_{C0}$, $I_{C+1}$ are set by the current control circuit 2315c, through the current setting signals $SET_{C-1}$, $SET_{C0}$, $SET_{C+1}$. The current values of the source currents $I_{C-1}$, $I_{C0}$, $I_{C+1}$ respectively correspond to the tap coefficients $C_{-1}$, $C_0$, $C_{+1}$. Thus, by setting the current sources $SRC_{C-1}$, $SR_{C0}$, $SRC_{C+1}$ with the current setting signals $SET_{C-1}$, $SET_{C0}$, $SET_{C+1}$, the transmission signal, as a combination of the positive output signal OUTp and the negative output signal OUTn, is equalized.

The current source $SRC_{C-1}$ is electrically connected to the switches $SW_{p1}$, $SW_{n1}$. As a switch control signal $Sctl_1$ controls the switch $SW_{p1}$, and the switch $SW_{n1}$ is controlled by the output of the inverter INV1, the switching statuses of switches $SW_{p1}$, $SW_{n1}$ are opposite. The source current $I_{C-1}$ is conducted to the positive output terminal OUTp when the switch $SW_{p1}$ is switched on and the switch $SW_{n1}$ is switched off. Or, the source current $I_{C-1}$ is conducted to the negative output terminal OUTp when the switch $SW_{p1}$ is switched off and the switch $SW_{n1}$ is switched on. As the relationships between the switches $SW_{p2}$, $SW_{n2}$ and the current source $SRC_{C0}$ and the relationships between the switches $SW_{p3}$, $SW_{n3}$, and the current source $SRC_{C+1}$ are similar to those of the switches $SW_{p1}$, $SW_{n1}$, and the current source $SRC_{C-1}$, details of which are omitted.

In FIG. 3B, the current mode driver (cmDRV) 2333b includes current sources $SRC_{C-1}$, $SRC_{C0}$, $SRC_{C+1}$, inverters INV1, INV2, INV3, and switches $SW_{p1}$, $SW_{n1}$, $SW_{p2}$, $SW_{n2}$, $SW_{p3}$, $SW_{n3}$, The connections between the inverters INV1, INV2, INV3 and the mappings between the inverters INV1, INV2, INV3, and the switches $SW_{n1}$, $SW_{n2}$, $SW_{n3}$ are similar to those in FIG. 3A.

The connections related to the current sources $SRC_{C-1}$, $SRC_{C+1}$ are similar to those in FIG. 3A. However, the connections related to the current source $SRC_{C0}$ in FIGS. 3A and 3B are different.

The current source $SRC_{C0}$ in FIG. 3B is electrically connected to the ground terminal Gnd, not the supply voltage terminal Vdd. Therefore, in FIG. 3B, the current sources $SRC_{C-1}$, $SRC_{C+1}$ respectively provide source currents $I_{C-1}$, $I_{C+1}$, but the current source $SRC_{C0}$ provides a sink current $I_{C0}$. The sink current $I_{C0}$ is conducted to the positive output terminal OUTp when the switch $SW_{p2}$ is switched on, and the switch $SW_{n2}$ is switched off, and the sink current $I_{C0}$ is conducted to the negative output terminal OUTp when the switch $SW_{p2}$ is switched off, and the switch $SW_{n2}$ is switched on.

In FIGS. 3A and 3B, the loading circuit (ldCKT) 25 includes a positive loading resistor RLp and a negative loading resistor RLn. The resistances of the positive loading resistor RLp and the negative loading resistor RLn are equivalent. The positive loading resistor RLp is electrically connected to the positive input terminal OUTp and the ground terminal Gnd. The negative loading resistor RLn is electrically connected to the negative input terminal OUTn and the ground terminal Gnd.

FIG. 4 is a schematic diagram illustrating an exemplary implementation of the voltage mode driver (vmDRV). The voltage mode driver (vmDRV) 2331 includes an upper voltage driving path 2331a and a lower voltage driving path 2331c. The upper voltage driving path 2331a receives the positive input signal INp and generates the positive output signal OUTp. On the other hand, the lower voltage driving path 2331c receives the negative input signal INn and generates the negative output signal OUTn.

The upper voltage driving path 2331a includes a PMOS transistor MTp1, an NMOS transistor MTn1, a pull-up resistor RTp1, and a pull-down resistor RTn1. The source terminals of the PMOS transistor MTp1 and the NMOS transistor MTn1 are respectively electrically connected to the supply voltage terminal Vdd and the ground terminal Gnd. The gate terminals of the PMOS transistor MTp1 and the NMOS transistor MTn1 are electrically connected to the positive input terminal INp. The pull-up resistor RTp1 is electrically connected to the drain terminal of the PMOS transistor MTp1 and the positive output terminal OUTp. The pull-down resistor RTn1 is electrically connected to the drain terminal of the NMOS transistor MTn1 and the positive output terminal OUTp. The lower voltage driving path 2331c includes a PMOS transistor MTp2, an NMOS transistor MTn2, a pull-up resistor RTp2, and a pull-down resistor RTn2. The source terminals of the PMOS transistor MTp2 and the NMOS transistor MTn2 are respectively electrically connected to the supply voltage terminal Vdd and the ground terminal Gnd. The gate terminals of the PMOS transistor MTp2 and the NMOS transistor MTn2 are electrically connected to the negative terminal INn. The pull-up resistor RTp2 is electrically connected to the drain terminal of the PMOS transistor MTp2 and the negative output terminal OUTp. The pull-down resistor RTn2 is electrically connected to the drain terminal of the NMOS transistor MTn2 and the negative output terminal OUTn.

FIG. 4 shows that the upper voltage driving path 2331a and the lower voltage driving path 2331c are inverter-based designs and have similar layouts. In the specification, the resistances of the pull-up resistors RTp1, RTp2, and the pull-down resistors RTn1, RTn2 are assumed to be equivalent.

Depending on the input bit inS, the voltage mode driver (vmDRV) 2331 may operate in two states. State one (ST1) (see FIG. 5A) represents that the input bit inS is equivalent to logic low "0" (inS=L). In state one (ST1), the positive input signal INp is set to the negative voltage (Inp=L), and the negative input signal INn is set to the positive voltage (INn=H). State two (ST2) (see FIG. 5B) represents that the input bit inS is equivalent to logic high "1" (inS=H). In state two (ST2), the positive input signal INp is set to the positive voltage (INp=H), and the negative input signal INn is set to the negative voltage (INn=L).

FIG. 5A is a schematic diagram illustrating state one (ST1) of the voltage mode driver (vmDRV). The upper voltage driving path 2331a and the lower voltage driving path 2331c are respectively described.

As the upper voltage driving path 2331a receives the negative voltage (INp=L), the PMOS transistor MTp1 is switched on, and the NMOS transistor MTn1 is switched off. Therefore, the pull-up resistor RTp1 conducts the supply voltage Vdd to the positive output terminal OUTp, and the pull-down resistor RTn1 is floating.

As the lower voltage driving path 2331c receives the positive voltage (INn=H), the PMOS transistor MTp2 is switched off, and the NMOS transistor MTn2 is switched on. Therefore, the pull-up resistor RTp2 is floating, and the pull-down resistor RTn2 conducts the ground voltage Gnd to the negative output terminal OUTn.

FIG. 5B is a schematic diagram illustrating state two (ST2) of the voltage mode driver (vmDRV). The upper voltage driving path 2331a and the lower voltage driving path 2331c are respectively described.

As the upper voltage driving path 2331a receives the positive voltage (INp=H), the PMOS transistor MTp1 is switched off, and the NMOS transistor MTn1 is switched on. Therefore, the pull-up resistor RTp1 is floating, and the pull-down resistor RTn1 conducts the ground voltage Gnd to the positive output terminal OUTp.

As the lower voltage driving path 2331c receives the negative voltage (INp=L), the PMOS transistor MTp2 is switched on, and the NMOS transistor MTn2 is switched off. Therefore, the pull-up resistor RTp2 conducts the supply voltage Vdd to the negative output terminal OUTn, and the pull-down resistor RTn2 is floating.

To summarize, the pull-up resistor RTp1 conducts the supply voltage Vdd to the positive output terminal OUTp, and the pull-down resistor RTn2 conducts the ground voltage Gnd to the negative output terminal OUTn when inS=L (see FIG. 5A). On the other hand, the pull-down resistor RTn1 conducts the ground voltage Gnd to the positive output terminal OUTp, and the pull-up resistor RTp2 conducts the supply voltage Vdd to the negative output terminal OUTn when inS=H (see FIG. 5B).

In the specification, the current mode driver (cmDRV) 2333a, 2333b is assumed to be implemented with three current sources $SRC_{C-1}$, $SRC_{C0}$, $SRC_{C+1}$. The current sources $SRC_{C-1}$, $SRC_{C0}$, $SRC_{C+1}$ might provide three source currents $I_{C+1}$, $I_{C0}$, $I_{C+1}$ (see FIG. 3A), or provide two source currents $I_{C-1}$, $I_{C+1}$, and one sink current $I_{C0}$ (see FIG. 3B).

In the following illustrations, details about how the voltage mode driver (vmDRV) and the current mode driver (cmDRV) are set to generate the de-emphasis voltage (Va), the flat level voltage (Vb), the pre-shoot voltage (Vc), and the maximum boost voltage (Vd) for pre-emphasis equalization are described. Table 3 summarizes the relationships between the implementations of the current mode driver (cmDRV) 2333a, 2333b, the positive input signal INp, the negative input signal INn, and figures.

TABLE 3

Figure 6A:
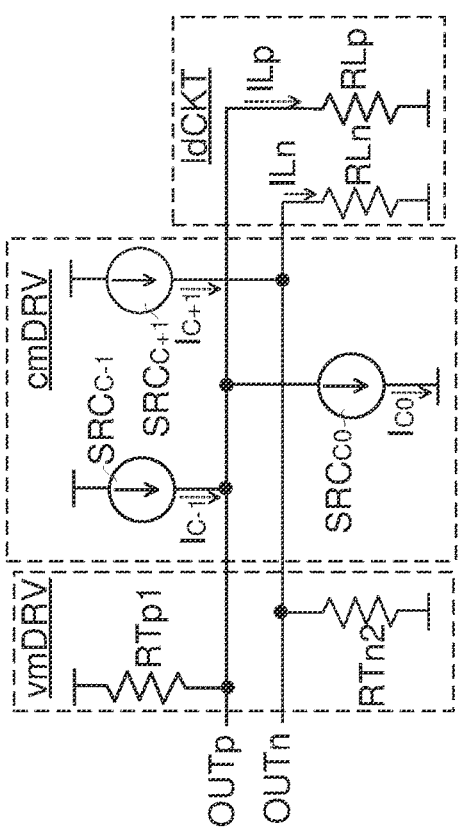
FIGS. 6A and 6B are schematic diagrams illustrating that the source currents $I_{C-1}$, $I_{C0}$, $I_{C+1}$ are conducted to generate the de-emphasis voltage (Va)
Figure 6B:
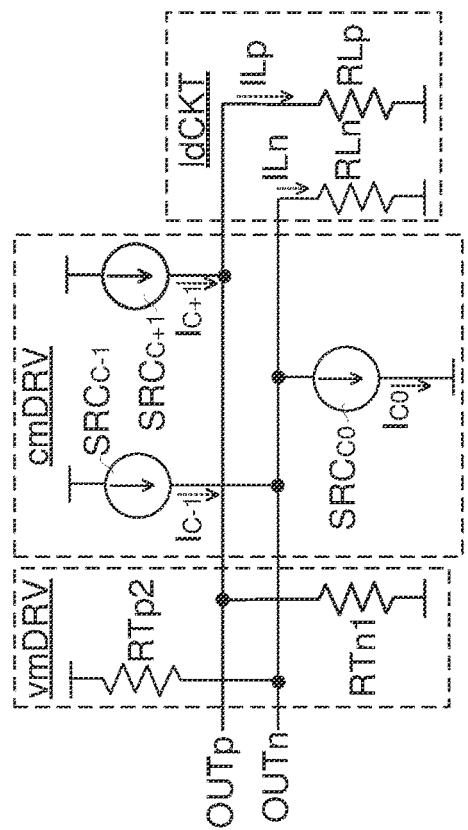
Figure 7A:
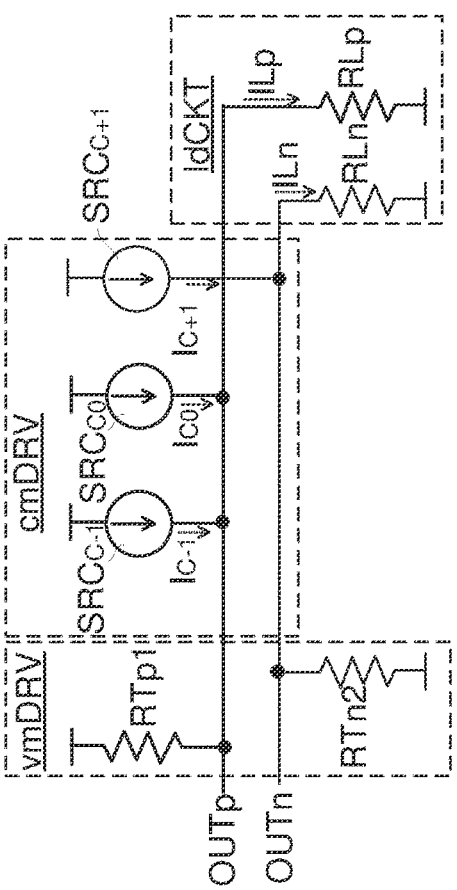
FIGS. 7A and 7B are schematic diagrams illustrating that the source currents $I_{C-1}$, $I_{C+1}$, and the sink current $I_{C0}$ are conducted to generate the de-emphasis voltage (Va)
Figure 7B:
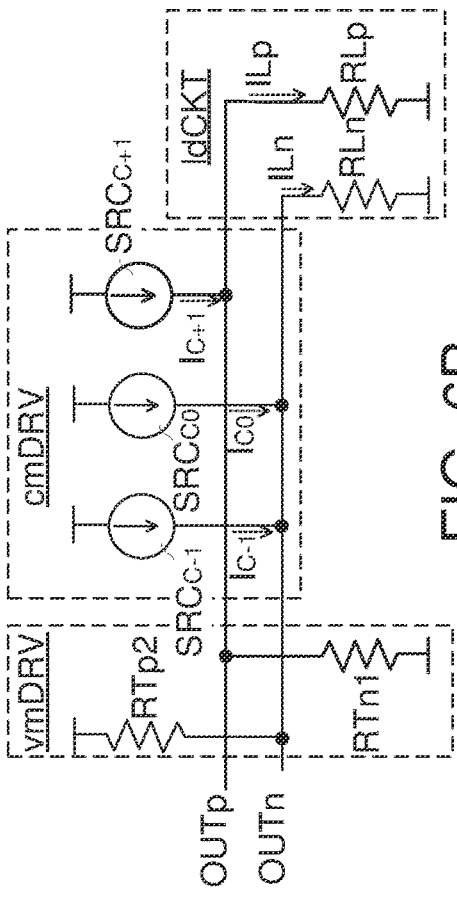
Figure 8A:
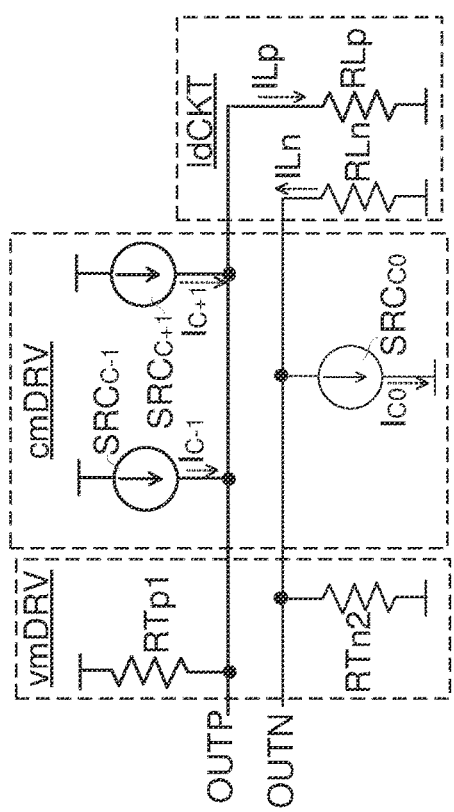
FIGS. 8A and 8B are schematic diagrams illustrating that the source currents $I_{C-1}$, $I_{C0}$, $I_{C+1}$ are conducted to generate the flat-level voltage (Vb)
Figure 9A:
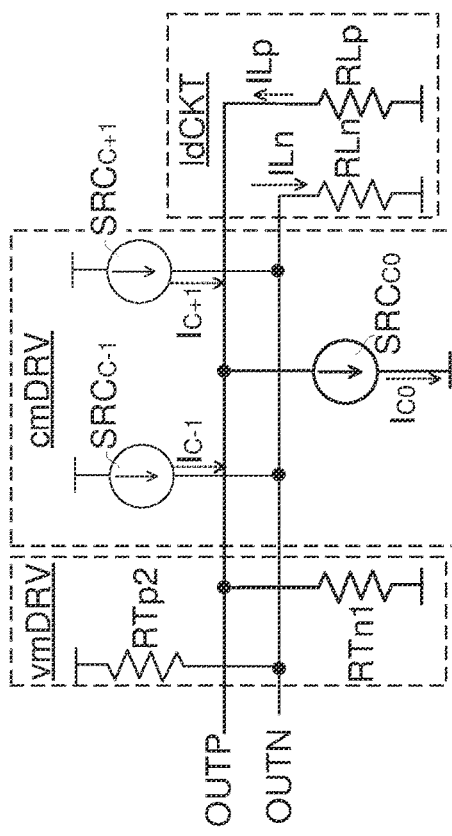
FIGS. 9A and 9B are schematic diagrams illustrating that the source currents $I_{C-1}$, $I_{C+1}$, and the sink current $I_{C0}$ are conducted to generate the flat-level voltage (Vb)
Figure 8B:
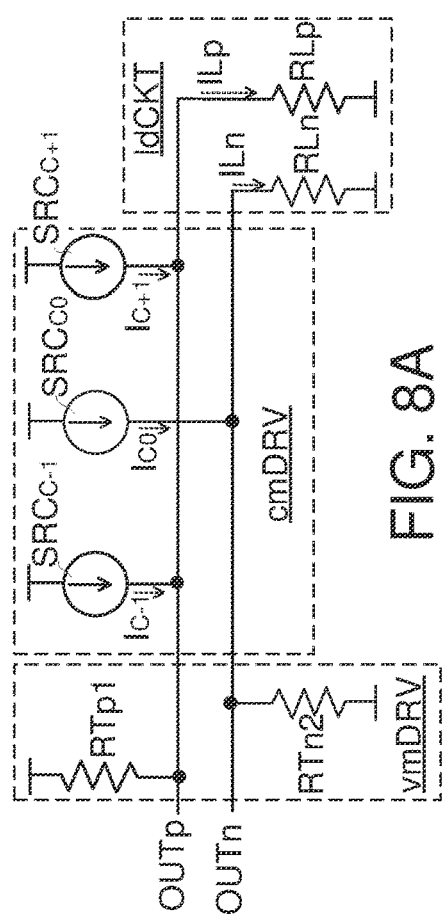
Figure 9B:
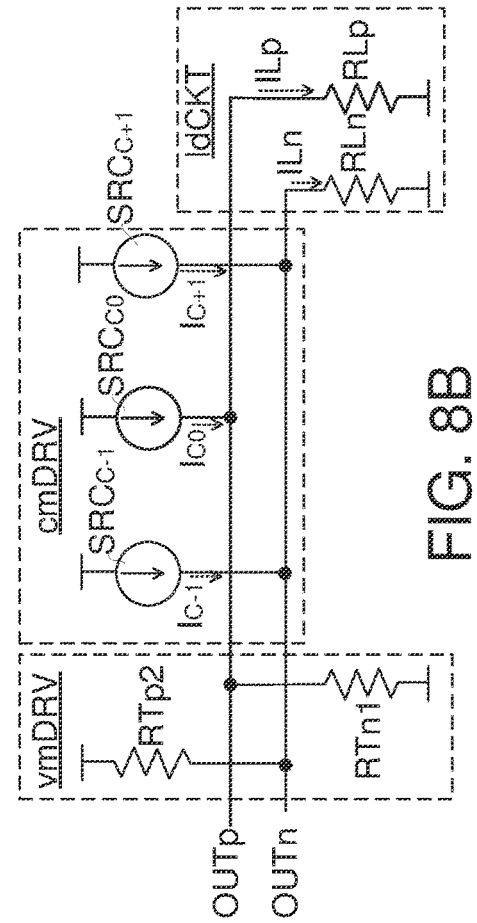
Figure 10A:
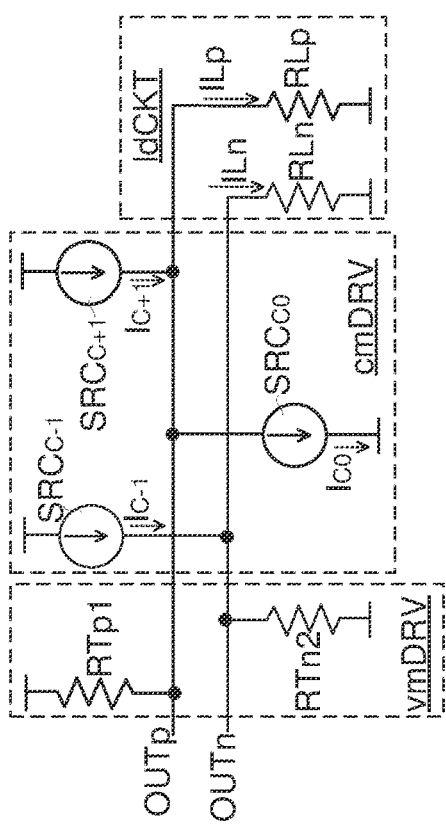
FIGS. 10A and 10B are schematic diagrams illustrating that the source currents $I_{C-1}$, $I_{C0}$, $I_{C+1}$ are conducted to generate the pre-shoot voltage (Vc)
Figure 10B:
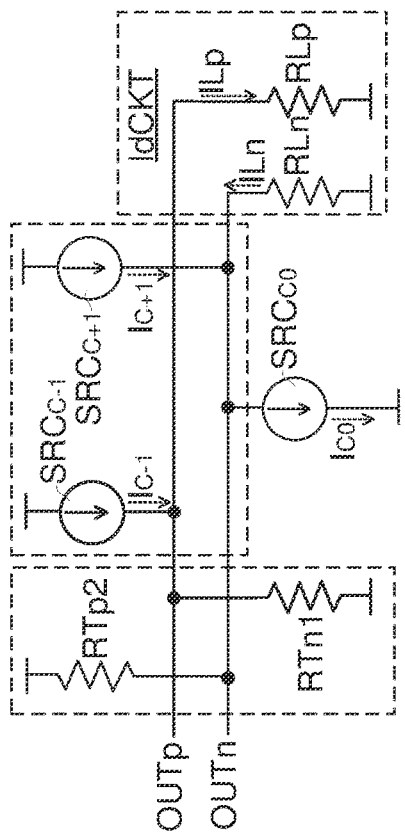
Figure 11A:
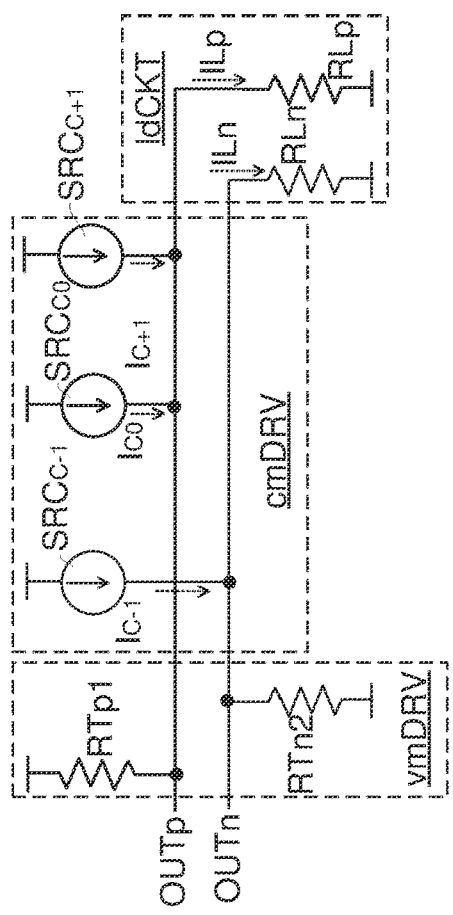
FIGS. 11A and 11B are schematic diagrams illustrating that the source currents $I_{C-1}$, $I_{C+1}$, and the sink current $I_{C0}$ are conducted to generate the pre-shoot voltage (Vc)
Figure 11B:
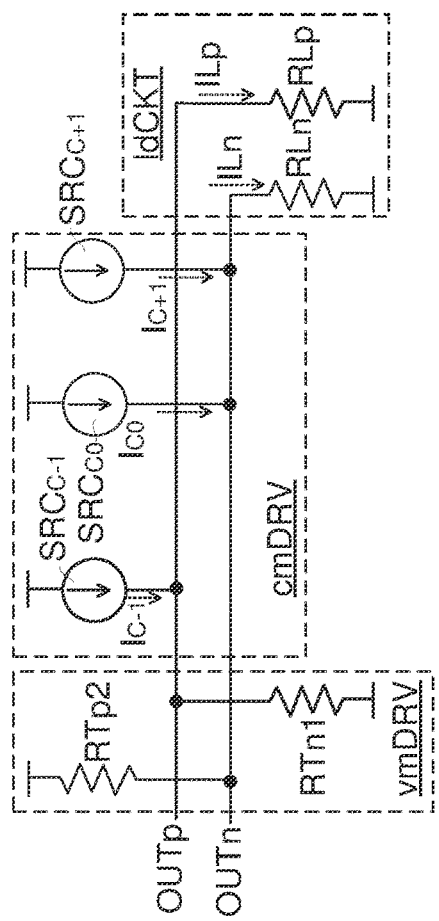
Figure 12A:
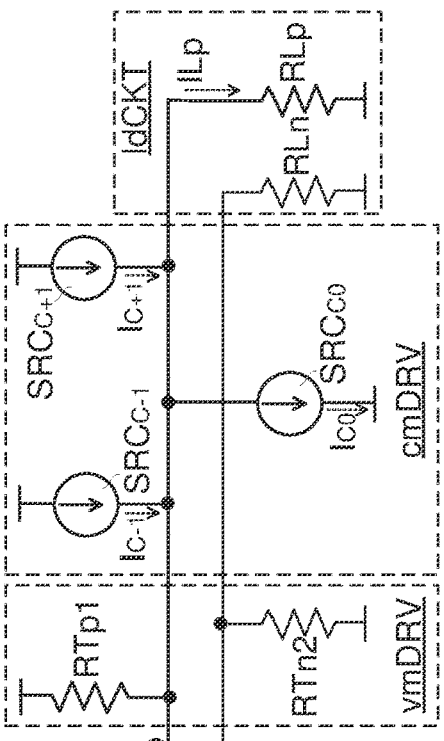
FIGS. 12A and 12B are schematic diagrams illustrating that the source currents $I_{C-1}$, $I_{C0}$, $I_{C+1}$ are conducted to generate the maximum boost voltage (Vd)
Figure 13A:
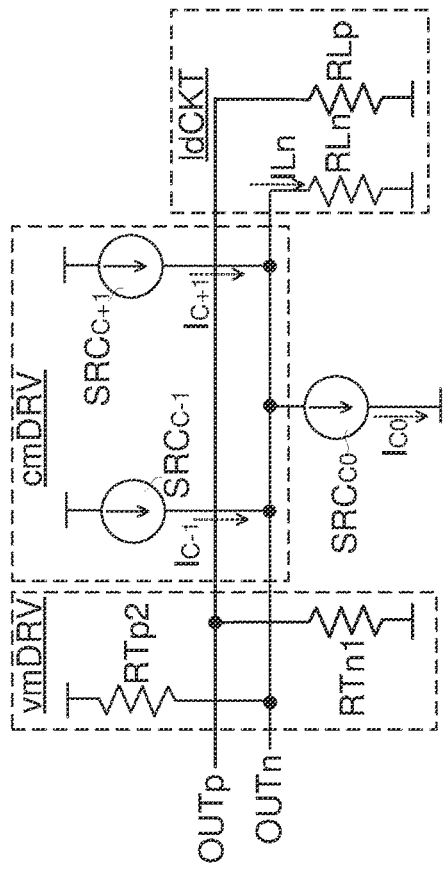
FIGS. 13A and 13B are schematic diagrams illustrating that the source currents $I_{C-1}$, $I_{C+1}$, and the sink current $I_{C0}$ are conducted to generate the maximum boost voltage (Vd)
Figure 12B:
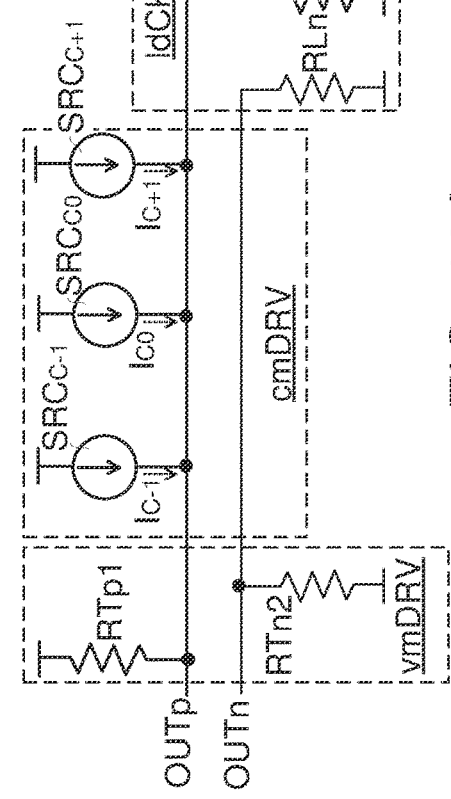
Figure 13B:
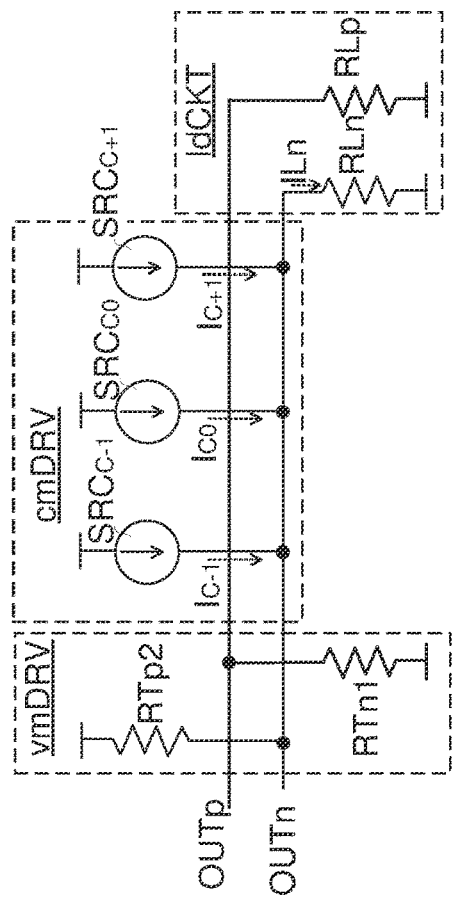

| Voltage levels to be generated for pre-emphasis equalization | | Va | Vb | Vc | Vd |
| --- | --- | --- | --- | --- | --- |
| three source currents ($I_{C-1}$, $I_{C0}$, $I_{C+1}$) are provided | INp = L and INn = H (ST1) | FIG. 6A | FIG. 8A | FIG. 10A | FIG. 12A |
| | INp = H and INn = L (ST2) | FIG. 6B | FIG. 8B | FIG. 10B | FIG. 12B |
| two source currents ($I_{C-1}$, $I_{C+1}$) and one sink current ($I_{C0}$) are provided | INp = L and INn = H (ST1) | FIG. 7A | FIG. 9A | FIG. 11A | FIG. 13A |
| | INp = H and INn = L (ST2) | FIG. 7B | FIG. 9B | FIG. 11B | FIG. 13B |

In the following descriptions, components related to the positive output signal OUTp are defined as an upper conduction path, and components related to the negative output signal OUTn are defined as a lower conduction path. For clarification purposes, the upper conduction paths are shown with thicker lines, and the lower conduction paths are shown with thinner lines.

For the sake of illustration, the double slash symbols (parallel symbols) "//" are used in the specification to represent the equivalent resistance of resistors being connected in parallel. For example, RTp1//RLp represents the parallel equivalent resistance of the pull-up resistor RTp1 and the positive loading resistor RLp being connected in parallel. That is, RTp1//RLp=RTp1*RLp/(RTp1+RLp).

FIGS. 6A, 6B, 7A, and 7B are related to the generation of the de-emphasis voltage (Va). In FIGS. 6A and 6B, the current source $SRC_{C0}$ provides the source current $I_{C0}$. In FIGS. 7A and 7B, the current source $SRC_{C0}$ provides the sink current $I_{C0}$.

FIGS. 6A and 6B are schematic diagrams illustrating how to generate the de-emphasis voltage (Va) based on the source currents $I_{C-1}$, $I_{C0}$, $I_{C+1}$ when the voltage mode driver (vmDRV) is in state one (ST1) and state two (ST2), respectively.

FIG. 6A corresponds to the scenario when the voltage mode driver (vmDRV) 2331 is in state one (ST1). Please refer to FIGS. 3A, 5A, and 6A together. In FIG. 6A, the current sources $SRC_{C-1}$, $SRC_{C0}$ are conducted to the positive output terminal OUTp, and the current source $SRC_{C+1}$ is conducted to the negative output terminal OUTn. Parameters related to the positive output signal OUTp and the negative output signal OUTn in FIG. 6A are listed in Table 4.

TABLE 4

| conduction path | upper conduction path | lower conduction path |
|---|---|---|
| related components | RTp1, $SRC_{C-1}$, $SRC_{C0}$, RLp | RTn2, $SRC_{C+1}$, RLn |
| loading current | $ILp = (I_{C-1} + I_{C0})$ | $ILn = I_{C+1}$ |
| DC component | $Vdc\_p = Vdd*RLp/(RTp1 + RLp)$ | $Vdc\_n = 0$ V |
| swing component | $Vsw\_p = ILp*(RTp1//RLp)$ | $Vsw\_n = ILn*(RTn2//RLn)$ |
| output signal | $OUTp = Vdc\_p + Vsw\_p$ | $OUTn = Vsw\_n$ |

In FIG. 6A, the upper conduction path includes the pull-up resistor RTp1, the current sources $SRC_{C-1}$, $SRC_{C0}$, and the positive loading resistor RLp, and the lower conduction path includes the pull-down resistor RTn2, the current source $SRC_{C+1}$, and the negative loading resistor RLn.

In the upper conduction path, the positive output signal OUTp includes a DC component Vdc_p and a swing component Vsw_p. As the pull-up resistor RTp1 conducts the supply voltage Vdd to the positive output terminal OUTp, the DC component Vdc_p of the positive output signal OUTp can be obtained by the supply voltage Vdd and a resistive divider including the pull-up resistor RTp1 and the positive loading resistor RLp (that is, $Vdc\_p=Vdd*RLp/(RTp1+RLp)$). On the other hand, the swing component Vsw_p of the positive output signal OUTp can be represented as a product of the positive loading current ILp times the parallel equivalent resistance of the pull-up resistor RTp1 and the positive loading resistor RLp (that is, $Vsw\_p=ILp*(RTp1//RLp)$).

In the lower conduction path, the pull-down resistor RTn2 conducts the ground voltage Gnd to the negative output terminal OUTn. Thus, the DC component Vdc_n of the negative output signal OUTn is equivalent to 0V, and the negative output signal OUTn includes only a swing component Vsw_n. The swing component Vsw_n of the negative output signal OUTn can be represented as a product of the negative loading current ILn times the parallel equivalent resistance of the pull-down resistor RTn2 and the negative loading resistor RLn (that is, $Vsw\_n=ILn*(RTn2//RLn)$).

FIG. 6B corresponds to the scenario when the voltage mode driver (vmDRV) 2331 is in state two (ST2). Please refer to FIGS. 3A, 5B, and 6B together. In FIG. 6B, the current source $SRC_{C+1}$ is conducted to the positive output terminal OUTp, and the current sources $SRC_{C-1}$, $SRC_{C0}$ are conducted to the negative output terminal OUTn. Parameters related to generations of the positive output signal OUTp and the negative output signal OUTn in FIG. 6B are listed in Table 5.

TABLE 5

| conduction path | upper conduction path | lower conduction path |
|---|---|---|
| related components | RTn1, $SRC_{C+1}$, RLp | RTp2, $SRC_{C-1}$, $SRC_{C0}$, RLn |
| loading current | $ILp = I_{C+1}$ | $ILn = (I_{C-1} + I_{C0})$ |
| DC component | $Vdc\_p = 0$ V | $Vdc\_n = Vdd*RLn/(RTp2 + RLn)$ |

TABLE 5-continued

| conduction path | upper conduction path | lower conduction path |
|---|---|---|
| swing component | $Vsw\_p = ILp*(RTn1//RLp)$ | $Vsw\_n = ILn*(RTp2//RLn)$ |
| output signal | $OUTp = Vsw\_p$ | $OUTn = Vdc\_n+Vsw\_n$ |

In FIG. 6B, the upper conduction path includes the pull-down resistor RTn1, the current source $SRC_{C+1}$, and the positive loading resistor RLp. The lower conduction path includes the pull-up resistor RTp2, the current sources $SRC_{C-1}$, $SRC_{C0}$, and the negative loading resistor RLn.

In the upper conduction path, the pull-down resistor RTn1 conducts the ground voltage Gnd to the positive output terminal OUTp. Thus, the DC component Vdc_p of the positive output signal OUTp is equivalent to 0V, and the positive output signal OUTp includes only a swing component Vsw_p. The swing component Vsw_p of the positive output signal OUTp can be represented as a product of the positive loading current ILp times the parallel equivalent resistance of the pull-down resistor RTn1 and the positive loading resistor RLp (that is, $Vsw\_p=ILp*(RTn1//RLp)$).

In the lower conduction path, the negative output signal OUTn includes a DC component Vdc_n and a swing component Vsw_n. As the pull-up resistor RTp2 conducts the supply voltage Vdd to the negative output terminal OUTn, the DC component Vdc_n of the negative output signal OUTn can be obtained by the supply voltage Vdd and a resistive divider including the pull-up resistor RTp2 and the negative loading resistor RLn (that is, $Vdc\_n=Vdd*RLn/(RTp2+RLn)$). On the other hand, the swing component Vsw_n of the negative output signal OUTn can be represented as a product of the negative loading current ILn times the parallel equivalent resistance of the pull-up resistor RTp2 and the negative loading resistor RLn (that is, $Vsw\_n=ILn*(RTp2//RLn)$).

FIGS. 7A and 7B are schematic diagrams illustrating how to generate the de-emphasis voltage (Va) based on the source currents $I_{C-1}$, $I_{C+1}$ and the sink current $I_{C0}$ when the voltage mode driver (vmDRV) is in state one (ST1) and state two (ST2), respectively.

FIG. 7A corresponds to the scenario when the voltage mode driver (vmDRV) 2331 is in state one (ST1). Please refer to FIGS. 3B, 5A, and 7A together. In FIG. 7A, the current sources $SRC_{C-1}$, $SRC_{C0}$ are conducted to the positive output terminal OUTp, and the current source $SRC_{C+1}$ is conducted to the negative output terminal OUTn. Parameters related to generations of the positive output signal OUTp and the negative output signal OUTn in FIG. 7A are listed in Table 6.

TABLE 6

| conduction path | upper conduction path | lower conduction path |
|---|---|---|
| related components | RTp1, $SRC_{C-1}$, $SRC_{C0}$, RLp | RTn2, $SRC_{C+1}$, RLn |
| loading current | $ILp = (I_{C-1} - I_{C0})$ | $ILn = I_{C+1}$ |
| DC component | $Vdc\_p = Vdd*RLp/(RTp1 + RLp)$ | $Vdc\_n = 0$ V |
| swing component | $Vsw\_p = ILp*(RTp1//RLp)$ | $Vsw\_n = ILn*(RTn2//RLn)$ |
| output signal | $OUTp = Vdc\_p + Vsw\_p$ | $OUTn = Vsw\_n$ |

In FIG. 7A, the upper conduction path includes the pull-up resistor RTp1, the current sources $SRC_{C-1}$, $SRC_{C0}$, and the positive loading resistor RLp, and the lower conduction path includes the pull-down resistor RTn2, the current source $SRC_{C+1}$, and the negative loading resistor RLn.

In the upper conduction path, the positive output signal OUTp includes a DC component Vdc_p and a swing component Vsw_p. As the pull-up resistor RTp1 conducts the supply voltage Vdd to the positive output terminal OUTp, the DC component Vdc_p of the positive output signal OUTp can be obtained by the supply voltage Vdd and a resistive divider including the pull-up resistor RTp1 and the positive loading resistor RLp (that is, Vdc_p=Vdd*RLp/(RTp1+RLp)). On the other hand, the swing component Vsw_p of the positive output signal OUTp can be represented as a product of the positive loading current ILp times the parallel equivalent resistance of the pull-up resistor RTp1 and the positive loading resistor RLp (that is, Vsw_p=ILp*(RTp1//RLp)).

In the lower conduction path, the pull-down resistor RTn2 conducts the ground voltage Gnd to the negative output terminal OUTn. Thus, the DC component Vdc_n of the negative output signal OUTn is equivalent to 0V, and the negative output signal OUTn includes only a swing component Vsw_n. The swing component Vsw_n of the negative output signal OUTn can be represented as a product of the negative loading current ILn times the parallel equivalent resistance of the pull-down resistor RTn2 and the negative loading resistor RLn (that is, Vsw_n=ILn*(RTn2//RLn)). FIG. 7B corresponds to the scenario when the voltage mode driver (vmDRV) 2331 is in state two (ST2). Please refer to FIGS. 3B, 5B, and 7B together. In FIG. 7B, the current source $SRC_{C+1}$ is conducted to the positive output terminal OUTp, and the current sources $SRC_{C-1}$, $SRC_{C0}$ are conducted to the negative output terminal OUTn. Parameters related to generations of the positive output signal OUTp and the negative output signal OUTn in FIG. 7B are listed in Table 7.

TABLE 7

| conduction path | upper conduction path | lower conduction path |
|---|---|---|
| related components | RTn1, $SRC_{C+1}$, RLp | RTp2, $SRC_{C-1}$, $SRC_{C0}$, RLn |
| loading current | ILp = $I_{C+1}$ | ILn = ($I_{C-1}$ − $I_{C0}$) |
| DC component | Vdc_p = 0 V | Vdc_n = Vdd*RLn/(RTp2 + RLn) |
| swing component | Vsw_p = ILp*(RTn1//RLp) | Vsw_n = ILn*(RTp2//RLn) |
| output signal | OUTp = Vsw_p | OUTn = Vdc_n + Vsw_n |

In FIG. 7B, the upper conduction path includes the pull-down resistor RTn1, the current source $SRC_{C+1}$, and the positive loading resistor RLp. The lower conduction path includes the pull-up resistor RTp2, the current sources $SRC_{C-1}$, $SRC_{C0}$, and the negative loading resistor RLn.

In the upper conduction path, the pull-down resistor RTn1 conducts the ground voltage Gnd to the positive output terminal OUTp. Thus, the DC component Vdc_p of the positive output signal OUTp is equivalent to 0V, and the positive output signal OUTp includes only a swing component Vsw_p. The swing component Vsw_p of the positive output signal OUTp can be represented as a product of the negative loading current ILn times the parallel equivalent resistance of the pull-down resistor RTn1 and the positive loading resistor RLp (that is, Vsw_p=ILp*(RTn1//RLp)).

In the lower conduction path, the negative output signal OUTn includes a DC component Vdc_n and a swing component Vsw_n. As the pull-up resistor RTp2 conducts the supply voltage Vdd to the negative output terminal OUTn, the DC component Vdc_n of the negative output signal OUTn can be obtained by the supply voltage Vdd and a resistive divider including the pull-up resistor RTp2 and the negative loading resistor RLn (that is, Vdc_n=Vdd*RLn/(RTp2+RLn)). On the other hand, the swing component Vsw_n of the negative output signal OUTn can be represented as a product of the negative loading current ILn times the parallel equivalent resistance of the pull-up resistor RTp2 and the negative loading resistor RLn (that is, Vsw_n=ILn*(RTp2//RLn)).

Please refer to FIGS. 6A and 7A together. FIGS. 6A and 7A represent that the current mode driver (cmDRV) is adjusted to make the physical driving module output the de-emphasis voltage (Va) when the voltage mode driver (vmDRV) operates in state one (ST1). The parameters in FIGS. 6A and 7A are listed and compared in Table 8.

TABLE 8 generation of de-emphasis voltage (Va) when INp = L and INn = H (ST1)

| FIG. | | FIG. 6A | FIG. 7A |
|---|---|---|---|
| upper conduction path | ILp OUTp | ILp = $I_{C-1}$ + $I_{C0}$<br>OUTp = Vdc_p + Vsw_p = Vdd*RLp/(RTp1 + RLp) + ILp*(RTp1//RLp) | ILp = $I_{C-1}$ − $I_{C0}$ |
| lower conduction path | ILn OUTn | ILn = $I_{C+1}$<br>OUTn = Vsw_n = ILn*(RTn2//RLn) | |

FIGS. 6A and 7A demonstrate that when the voltage mode driver (vmDRV) operates in state one (ST1), the positive output signal OUTp includes the DC component Vdc_p and the swing component Vsw_p, and the negative output signal OUTn includes only the swing component Vsw_n.

Please compare the upper conduction paths in FIGS. 6A and 7A together. The DC components Vdc_p of the positive output signal OUTp in FIGS. 6A and 7A are equivalent (that is, Vdc_p=Vdd*RLp/(RTp1+RLp)). Moreover, both the swing components Vsw_p of the positive output signal OUTp in FIGS. 6A and 7A can be represented as the Vsw_p=ILp*(RTp1//RLp). Please note that the current values of the positive loading currents ILp in FIGS. 6A and 7A are different. The positive loading current ILp is equivalent to the summation of the source currents $I_{C-1}$, $I_{C0}$ (that is, ILp=$I_{C-1}$+$I_{C0}$) in FIG. 6A, and the positive loading current ILp is equivalent to the summation of the source current $I_{C-1}$ and the sink current $I_{C0}$ (that is, ILp=$I_{C-1}$−$I_{C0}$) in FIG. 7A.

Please compare the lower conduction paths in FIGS. 6A and 7A together. The swing components Vsw_n of the negative output signal OUTn in FIGS. 6A and 7A can be represented by the equation OUTn=ILn*(RTn2//RLn), wherein negative loading current ILn is equivalent to the source current $I_{C+1}$ (that is, ILn=$I_{C+1}$).

Please refer to FIGS. 6B and 7B together. FIGS. 6B and 7B represent that the current mode driver (cmDRV) is adjusted to make the physical driving module output the de-emphasis voltage (Va) when the voltage mode driver (vmDRV) operates in state two (ST2). The parameters in FIGS. 6B and 7B are listed and compared in Table 9.

TABLE 9 generation of de-emphasis voltage (Va) when
INp = H and INn = L (ST2)

| FIG. | | FIG. 6B | FIG. 7B |
|---|---|---|---|
| upper conduction path | ILp OUTp | ILp = $I_{C+1}$ OUTn = Vsw_p = ILp*(RTn1//RLp) | |
| lower conduction path | ILn OUTn | ILn = $I_{C-1}$ + $I_{C0}$ OUTn = Vdc_n + Vsw_n = Vdd*RLn/ (RTp2 + RLn) + ILn*(RTp2//RLn) | ILn = $I_{C-1}$ − $I_{C0}$ |

FIGS. 6B and 7B demonstrate that when the voltage driver (vmDRV) operates in state two (ST2), the positive output signal OUTp includes only the swing component Vsw_p, and the negative output signal OUTn includes the DC component Vdc_n and the swing component Vsw_n.

Please compare the upper conduction paths in FIGS. 6B and 7B together. The swing components Vsw_n of the positive output signal OUTp in FIGS. 6B and 7B can be represented as Vsw_n=ILn*(RTn1//RLp), wherein the positive loading current ILp is equivalent to the source current $I_{C+1}$.

Please compare the lower conduction paths in FIGS. 6B and 7B together. The DC components Vdc_n of the negative output signal OUTn in FIGS. 6B and 7B are equivalent (that is, Vdc_n=Vdd*RLn/(RTp2+RLn)). Moreover, both the swing components of the negative output signal OUTn in FIGS. 6B and 7B can be represented as OUTn=ILn*(RTp2//RLn). Please note the current values of the negative loading currents ILn in FIGS. 6B and 7B are different. The negative loading current ILn is equivalent to the summation of the source currents $I_{C-1}$, $I_{C0}$ (that is, ILn=$I_{C-1}$+$I_{C0}$) in FIG. 6B, and the negative lading current ILn is equivalent to the summation of the source current $I_{C-1}$ and the sink current $I_{C0}$ (that is, ILn=$I_{C-1}$−$I_{C0}$) in FIG. 7B.

The settings and operations of the voltage mode driver (vmDRV) 2331 for generating the de-emphasis voltage (Va) have been described thoroughly in FIGS. 6A, 6B, 7A, and 7B. To avoid redundancy, the generation of the flat level voltage (Vb), the pre-shoot voltage (Vc), and the maximum boost voltage (Vd) are not described in detail as the de-emphasis voltage (Va).

FIGS. 8A, 8B, 9A, and 9B are related to the generation of the flat level voltage (Vb). In FIGS. 8A and 8B, the current source $SRC_{C0}$ provides the source current $I_{C0}$. In FIGS. 9A and 9B, the current source $SRC_{C0}$ provides the sink current $I_{C0}$. The switching statuses of the switches $SW_{p1}$, $SW_{n1}$, $SW_{p2}$, $SW_{n2}$, $SW_{p3}$, $SW_{n3}$ corresponding to FIGS. 8A, 8B, 9A, and 9B are summarized in Table 10.

TABLE 10

| switch control signal | | $Sctl_1$ | | $Sctl_2$ | | $Sctl_3$ | |
|---|---|---|---|---|---|---|---|
| | | $SW_{p1}$ | $SW_{n1}$ | $SW_{p2}$ | $SW_{n2}$ | $SW_{p3}$ | $SW_{n3}$ |
| FIGS. 8A and 9A | switch state | ON | OFF | OFF | ON | ON | OFF |
| FIGS. 8B and 9B | switch state | OFF | ON | ON | OFF | OFF | ON |

FIGS. 8A and 8B are schematic diagrams illustrating how to generate the flat-level voltage (Vb) based on the source currents $I_{C-1}$, $I_{C0}$, $I_{C+1}$ when the voltage mode driver (vmDRV) is in state one (ST1) and state two (ST2), respectively.

Please refer to Table 10 and FIGS. 3A, 5A, and 8A together. In FIG. 8A, the upper conduction path includes the pull-up resistor RTp1, the current sources $SRC_{C-1}$, $SRC_{C+1}$, and the positive loading resistor RLp, and the positive loading current ILp is determined by the source currents $I_{C-1}$, $I_{C+1}$. That is, ILp=($I_{C-1}$+$I_{C0}$). Besides, the lower conduction path includes the pull-down resistor RTn2, the current source $SRC_{C0}$, and the negative loading resistor RLn, and the negative loading current ILn is determined by the source current $I_{C0}$. That is, ILn=$I_{C0}$.

Please refer to Table 10 and FIGS. 3A, 5B, and 8B together. In FIG. 8B, the upper conduction path includes the pull-down resistor RTn1, the current source $SRC_{C0}$, and the positive loading resistor RLp, and the positive loading current ILp is determined by the source current $I_{C0}$. That is, ILp=$I_{C0}$. Besides, the lower conduction path includes the pull-up resistor RTp2, the current sources $SRC_{C-1}$, $SRC_{C+1}$, and the negative loading resistor RLn, and the negative loading current ILn is determined by the source currents $I_{C-1}$, $I_{C+1}$. That is, ILn=($I_{C-1}$+$I_{C+1}$).

FIGS. 9A and 9B are schematic diagrams illustrating how to generate the flat-level voltage (Vb) based on the source currents $I_{C-1}$, $I_{C+1}$, and the sink current $I_{C0}$ when the voltage mode driver (vmDRV) is in state one (ST1) and state two (ST2), respectively.

Please refer to Table 10 and FIGS. 3B, 5A, and 9A together. In FIG. 9A, the upper conduction path includes the pull-up resistor RTp1, the current sources $SRC_{C+1}$, $SRC_{C+1}$, and the positive loading resistor RLp, and the positive loading current ILp is determined by the source currents $I_{C+1}$, $I_{C+1}$. That is, ILp=($I_{C-1}$+$I_{C+1}$). Besides, the lower conduction path includes the pull-down resistor RTn2, the current source $SRC_{C0}$, and the negative loading resistor RLn, and the negative loading current ILn is determined by the sink current $I_{C0}$. That is, ILn=−$I_{C0}$.

Please refer to Table 10 and FIGS. 3B, 5B, and 9B together. In FIG. 9B, the upper conduction path includes the pull-down resistor RTn1, the current source $SRC_{C0}$, and the positive loading resistor RLp, and the positive loading current ILp is determined by the sink current $I_{C0}$. That is, ILp=$I_{C0}$. Besides, the lower conduction path includes the pull-up resistor RTp2, the current sources $SRC_{C-1}$, $SRC_{C+1}$, and the negative loading resistor RLn, and the negative loading current ILn is determined by the source currents $I_{C-1}$, $I_{C+1}$. That is, ILn=($I_{C-1}$+$I_{C+1}$).

Please refer to FIGS. 8A and 9A together. FIGS. 8A and 9A represent that the current mode driver (cmDRV) is adjusted to make the physical driving module output the flat-level voltage (Vb) when the voltage mode driver (vmDRV) operates in state one (ST1). The parameters in FIGS. 8A and 9A are listed and compared in Table 11.

TABLE 11 generation of flat-level voltage (Vb) when
INp = L and INn = H (ST1)

| FIG. | | FIG. 8A | FIG. 9A |
|---|---|---|---|
| upper conduction path | ILp OUTp | ILp = $I_{C-1}$ + $I_{C+1}$ OUTp = Vdc_p + Vsw_p = Vdd*RLp/ (RTp1 + RLp) + ILp*(RTp1//RLp) | |
| lower conduction path | ILn OUTn | ILn = $I_{C0}$ (source current) OUTn = Vsw_n = ILn*(RTn2//RLn) | ILn = −$I_{C0}$ (sink current) |

The upper conduction paths in FIGS. 8A and 9A are compared. The DC components Vdc_p of the positive output signal OUTp in FIGS. 8A and 9A are equivalent, (that is, Vdc_p=Vdd*RLp/(RTp1+RLp)). Moreover, both the swing components Vsw_p of the positive output signal OUTp in FIGS. 8A and 9A can be represented by the equation Vsw_p=ILp*(RTp1//RLp), wherein the positive loading current ILp is equivalent to the summation of source currents $I_{C-1}$, $I_{C+1}$ (that is, ILp=$I_{C-1}$+$I_{C+1}$).

The lower conduction paths in FIGS. 8A and 9A are compared. The swing components Vsw_n of the negative output signal OUTn in FIGS. 8A and 9A can be represented by the equation Vsw_n=ILn*(RTn2//RLn). Please note the current values of the negative loading currents ILn in FIGS. 8A and 9A are different. The negative loading current ILn is equivalent to the source current $I_{C0}$ (that is, ILn=$I_{C0}$) in FIG. 8A, and the negative loading current ILn is equivalent to the sink current $I_{C0}$ (that is, ILn=-$I_{C0}$) in FIG. 9A.

Please refer to FIGS. 8B and 9B together. FIGS. 8B and 9B represent that the current mode driver (cmDRV) is adjusted to make the physical driving module output the flat-level voltage (Vb) when the voltage mode driver (vmDRV) operates in state two (ST2). The parameters in FIGS. 8B and 9B are listed and compared in Table 12.

TABLE 12

| generation of flat-level voltage (Vb) when INp = H and INn = L (ST2) | | | |
|---|---|---|---|
| FIG. | | FIG. 8B | FIG. 9B |
| upper conduction path | ILp | ILp = $I_{C0}$ (source current) | ILp = -$I_{C0}$ (sink current) |
| | OUTp | OUTn = Vsw_p = ILp*(RTn1//RLp) | |
| lower conduction path | ILn | ILp = $I_{C-1}$ + $I_{C+1}$ | |
| | OUTn | OUTn = Vdc_n + Vsw_n = Vdd*RLn/(RTp2 + RLn) + ILn*(RTp2//RLn) | |

The upper conduction paths in FIGS. 8B and 9B are compared. The swing components Vsw_n of the positive output signal OUTp in FIGS. 8B and 9B can be represented by Vsw_n=ILn*(RTn1//RLp). Please note that the current values of the positive loading currents ILp in FIGS. 8B and 9B are different. The positive loading current ILp is equivalent to the source current $I_{C0}$ (that is, ILp=$I_{C0}$) in FIG. 8B, and the positive loading current ILp is equivalent to the sink current $I_{C0}$ (that is, ILp=-$I_{C0}$) in FIG. 9B.

The lower conduction paths in FIGS. 8B and 9B are compared. The DC components Vdc_n of the negative output signal OUTn in FIGS. 8B and 9B are equivalent (that is, Vdc_n=Vdd*RLn/(RTp2+RLn)). Moreover, both the swing components Vsw_n of the negative output signal OUTn in FIGS. 8B and 9B can be represented as Vsw_n=ILn*(RTp2//RLn), wherein the negative loading current ILn is equivalent to the summation of source currents $I_{C-1}$, $I_{C+1}$ (that is, ILn=$I_{C-1}$+$I_{C+1}$).

FIGS. 10A, 10B, 11A, and 11B are related to the generation of the pre-shoot voltage (Vc). In FIGS. 10A and 10B, the current source $SRC_{C0}$ provides the source current $I_{C0}$. In FIGS. 11A and 11B, the current source $SRC_{C0}$ provides the sink current $I_{C0}$ The switching statuses of the switches $SW_{p1}$, $SW_{n1}$, $SW_{p2}$, $SW_{n2}$, $SW_{p3}$, $SW_{n3}$ corresponding to FIGS. 10A, 10B, 11A, and 11B are summarized in Table 13.

TABLE 13

| switch control signal | | Sctl$_1$ | | Sctl$_2$ | | Sctl$_3$ | |
|---|---|---|---|---|---|---|---|
| FIGS. 10A and 11A | switch state | $SW_{p1}$ OFF | $SW_{n1}$ ON | $SW_{p2}$ ON | $SW_{n2}$ OFF | $SW_{p3}$ ON | $SW_{n3}$ OFF |

TABLE 13-continued

| switch control signal | | Sctl$_1$ | | Sctl$_2$ | | Sctl$_3$ | |
|---|---|---|---|---|---|---|---|
| FIGS. 10B and 11B | switch state | $SW_{p1}$ ON | $SW_{n1}$ OFF | $SW_{p2}$ OFF | $SW_{n2}$ ON | $SW_{p3}$ OFF | $SW_{n3}$ ON |

FIGS. 10A and 10B are schematic diagrams illustrating how to generate the pre-shoot voltage (Vc) based on the source currents $I_{C-1}$, $I_{C0}$, $I_{C+1}$ when the voltage mode driver (vmDRV) is in state one (ST1) and state two (ST2), respectively.

Please refer to Table 13 and FIGS. 3A, 5A, and 10A together. In FIG. 10A, the upper conduction path includes the pull-up resistor RTp1, the current sources $SRC_{C0}$, $SRC_{C+1}$, and the positive loading resistor RLp, and the positive loading current ILp is determined by the source currents $I_{C0}$, $I_{C+1}$. That is, ILp=($I_{C0}$+$I_{C+1}$) Besides, the lower conduction path includes the pull-down resistor RTn2, the current source $SRC_{C-1}$, and the negative loading resistor RLn, and the source current $I_{C-1}$ determines the negative loading current ILn. That is, ILn=$I_{C-1}$.

Please refer to Table 13 and FIGS. 3A, 5B, and 10B together. In FIG. 10B, the upper conduction path includes the pull-down resistor RTn1, the current source $SRC_{C-1}$, and the positive loading resistor RLp, and the positive loading current ILp is determined by the source current $I_{C-1}$. That is, ILp=$I_{C-1}$. Besides, the lower conduction path includes the pull-up resistor RTp2, the current sources $SRC_{C-1}$, $SRC_{C0}$, and the negative loading resistor RLn, and the negative loading current ILn is determined by the source currents $I_{C-1}$, $I_{C0}$. That is, ILn=($I_{C0}$+$I_{C+1}$).

FIGS. 11A and 11B are schematic diagrams illustrating how to generate the pre-shoot voltage (Vc) based on source currents $I_{C-1}$, $I_{C+1}$, and the sink current $I_{C0}$ when the voltage mode driver (vmDRV) is in state one (ST1) and state two (ST2), respectively.

Please refer to Table 13 and FIGS. 3B, 5A, and 11A together. In FIG. 11A, the upper conduction path includes the pull-up resistor RTp1, the current sources $SRC_{C0}$, $SRC_{C-1}$, and the positive loading resistor RLp, and the positive loading current ILp is determined by the sink current $I_{C0}$ and the source current $I_{C+1}$. That is, ILp=(-$I_{C0}$+$I_{C+1}$) Besides, the lower conduction path includes the pull-down resistor RTn2, the current source $SRC_{C-1}$, and the negative loading resistor RLn, and the negative loading current ILn is determined by the source current $I_{C-1}$. That is, ILn=$I_{C-1}$.

Please refer to Table 13 and FIGS. 3B, 5B, and 11B together. In FIG. 11B, the upper conduction path includes the pull-down resistor RTn1, the current source $SRC_{C-1}$, and the positive loading resistor RLp, and the positive loading current ILp is determined by the source current $I_{C-1}$. That is, ILp=$I_{C-1}$. Besides, the lower conduction path includes the pull-up resistor RTp2, the current sources $SRC_{C0}$, $SRC_{C+1}$, and the negative loading resistor RLn, and the negative loading current ILn is determined by the sink current $I_{C0}$ and the source current $I_{C+1}$. That is, ILn=(-$I_{C0}$+$I_{C+1}$).

Please refer to FIGS. 10A and 11A together. FIGS. 10A and 11A represent that the current mode driver (cmDRV) is adjusted to make the physical driving module output the pre-shoot voltage (Vc) when the voltage mode driver (vmDRV) operates in state one (ST1). The parameters in FIGS. 10A and 11A are listed and compared in Table 14.

TABLE 14 generation of pre-shoot voltage (Vc) when
INp = L and INn = H (ST1)

| | FIG. | FIG. 10A | FIG. 11A |
|---|---|---|---|
| upper conduction path | ILp OUTp | ILp = ($I_{C0}$ + $I_{C+1}$)<br>OUTp = Vdc_p + Vsw_p = Vdd*RLp/<br>(RTp1 + RLp) + ILp*(RTp1//RLp) | ILp = (−$I_{C0}$ + $I_{C+1}$) |
| lower conduction path | ILn OUTn | ILn = $I_{C-1}$<br>OUTn = Vsw_n = ILn*(RTn2//RLn) | |

The upper conduction paths in FIGS. 10A and 11A are compared. The DC components Vdc_p of the positive output signal OUTp in FIGS. 10A and 11A are equivalent, (that is, Vdc_p=Vdd*RLp/(RTp1+RLp)). Moreover, both the swing components Vsw_p of the positive output signal OUTp in FIGS. 10A and 11A can be represented by Vsw_p=ILp*(RTp1//RLp). Please note that current values of the positive loading current ILp are different in FIGS. 10A and 11A. The positive loading current ILp is equivalent to the summation of source currents $I_{C0}$, $I_{C+1}$ (that is, ILp=$I_{C0}$+$I_{C+1}$) in FIG. 10A, and the positive loading current ILp is equivalent to the summation of the sink current $I_{C0}$ and the source current $I_{C+1}$ (ILp=−$I_{C0}$+$I_{C+1}$) in FIG. 11A. The lower conduction paths in FIGS. 10A and 11A are compared. The swing components Vsw_n of the negative output signal OUTn in FIGS. 10A and 11A can be represented by Vsw_n=ILn*(RTn2//RLn), wherein the negative loading current ILn is equivalent to the source current $I_{C-1}$.

Please refer to FIGS. 10B and 11B together. FIGS. 10B and 11B represent that the current mode driver (cmDRV) is adjusted to make the physical driving module output the pre-shoot voltage (Vc) when the voltage mode driver (vmDRV) operates in state two (ST2). The parameters in FIGS. 10B and 11B are listed and compared in Table 15.

TABLE 15 generation of pre-shoot voltage (Vc) when
INp = H and INn = L (ST2)

| | FIG. | FIG. 10B | FIG. 11B |
|---|---|---|---|
| upper conduction path | ILp OUTp | ILp = $I_{C-1}$<br>OUTn = Vsw_p = ILp*(RTn1//RLp) | |
| lower conduction path | ILn OUTn | ILn = ($I_{C0}$ + $I_{C+1}$)<br>OUTn = Vdc_n + Vsw_n = Vdd*RLn/<br>(RTp2 + RLn) + ILn*(RTp2//RLn) | ILn = (−$I_{C0}$ + $I_{C+1}$) |

The upper conduction paths in FIGS. 10B and 11B are compared. The swing components Vsw_n of the positive output signal OUTp in FIGS. 10B and 11B can be represented by Vsw_n=ILn*(RTn1//RLp), wherein the positive loading current ILp is equivalent to the source current $I_{C-1}$ (that is, ILp=$I_{C-1}$).

The lower conduction paths in FIGS. 10B and 11B are compared. The DC components Vdc_n of the negative output signal OUTn in FIGS. 10B and 11B are equivalent, (that is, Vdc_n=Vdd*RLn/(RTp2+RLn)). Moreover, both the swing components Vsw_n of the negative output signal OUTn in FIGS. 10B and 11B can be represented as Vsw_n=ILn*(RTp2//RLn). Please note the current values of the negative loading currents ILn in FIGS. 10B and 11B are different. The negative loading current ILn is equivalent to the summation of source currents $I_{C0}$, $I_{C+1}$ (that is, ILn=$I_{C0}$+$I_{C+1}$) in FIG. 10B, and the negative loading current ILn is equivalent to the summation of the sink current $I_{C0}$ and the source current $I_{C+1}$ (ILp=−$I_{C0}$+$I_{C+1}$) in FIG. 11B.

FIGS. 12A, 12B, 13A, and 13B are related to the generation of the maximum boost voltage (Vd). In FIGS. 12A and 12B, the current source $SRC_{C0}$ provides the source current $I_{C0}$. In FIGS. 13A and 13B, the current source $SRC_{C0}$ provides the sink current $I_{C0}$. The switching statuses of the switches $SW_{p1}$, $SW_{n1}$, $SW_{p2}$, $SW_{n2}$, $SW_{p3}$, $SW_{n3}$ corresponding to FIGS. 12A, 12B, 13A, and 13B are summarized in Table 16.

TABLE 16

| switch control signal | | $Sctl_1$ | | $Sctl_2$ | | $Sctl_3$ | |
|---|---|---|---|---|---|---|---|
| | | $SW_{p1}$ | $SW_{n1}$ | $SW_{p2}$ | $SW_{n2}$ | $SW_{p3}$ | $SW_{n3}$ |
| FIGS. 12A and 13A | switch state | ON | OFF | ON | OFF | ON | OFF |
| FIGS. 12B and 13B | switch state | OFF | ON | OFF | ON | OFF | ON |

FIGS. 12A and 12B are schematic diagrams illustrating how to generate the maximum boost voltage (Vd) based on the source currents $I_{C-1}$, $I_{C0}$, $I_{C+1}$ when the voltage mode driver (vmDRV) is in state one (ST1) and state two (ST2), respectively.

Please refer to Table 16 and FIGS. 3A, 5A, and 12A together. In FIG. 12A, the upper conduction path includes the pull-up resistor RTp1, the current sources $SRC_{C-1}$, $SRC_{C0}$, $SRC_{C+1}$, and the positive loading resistor RLp. The positive loading current ILp is determined by the source currents $I_{C-1}$, $I_{C0}$, $I_{C+1}$. That is, ILp=($I_{C-1}$+$I_{C0}$+$I_{C+1}$) Besides, the lower conduction path includes the pull-down resistor RTn2 and the negative loading resistor RLn, and the negative loading current ILn is equivalent to 0. That is, ILn=0.

Please refer to Table 16 and FIGS. 3A, 5B, and 12B together. In FIG. 12B, the upper conduction path includes the pull-down resistor RTn1 and the positive loading resistor RLp, and the positive loading current ILp is equivalent to 0. That is, ILp=0. Besides, the lower conduction path includes the pull-up resistor RTp2, the current sources $SRC_{C-1}$, $SRC_{C0}$, $SRC_{C+1}$, and the negative loading resistor RLn, and the negative loading current ILn is determined by the source currents $IC_{C-1}$, $I_{C0}$, $I_{C+1}$. That is, ILn=($I_{C-1}$+$I_{C0}$+$I_{C+1}$).

FIGS. 13A and 13B are schematic diagrams illustrating how to generate the maximum boost voltage (Vd) based on the source currents $I_{C-1}$, $I_{C+1}$, and the sink current $I_{C0}$ when the voltage mode driver (vmDRV) is in state one (ST1) and state two (ST2), respectively.

Please refer to Table 16 and FIGS. 3B, 5A, and 13A together. In FIG. 13A, the upper conduction path includes the pull-up resistor RTp1, the current sources $SRC_{C-1}$, $SRC_{C0}$, $SRC_{C+1}$, and the positive loading resistor RLp. The positive loading current ILp is determined by the source currents $I_{C-1}$, $I_{C+1}$, and the sink current $SRC_{C0}$. That is, ILp=($I_{C-1}$−$I_{C0}$+$I_{C+1}$) Besides, the lower conduction path includes the pull-down resistor RTn2 and the negative loading resistor RLn, and the negative loading current ILn is equivalent to 0. That is, ILn=0.

Please refer to Table 16 and FIGS. 3B, 5B, and 13B together. In FIG. 13B, the upper conduction path includes the pull-down resistor RTn1 and the positive loading resistor RLp, and the positive loading current ILp is equivalent to 0. That is, ILp=0. Besides, the lower conduction path includes the pull-up resistor RTp2, the current sources $SRC_{C-1}$, $SRC_{C0}$, $SRC_{C0+1}$, and the negative loading resistor RLn, and the negative loading current ILn is determined by the source currents $I_{C-1}$, $I_{C0+1}$, and the sink current $I_{C0}$. That is, $ILn=(I_{C-1}-I_{C0}+I_{C+1})$.

Please refer to FIGS. 12A and 13A together. FIGS. 12A and 13A represent that the current mode driver (cmDRV) is adjusted to make the physical driving module output the maximum boost voltage (Vd) when the voltage mode driver (vmDRV) operates in state one (ST1). The parameters in FIGS. 12A and 13A are listed and compared in Table 17.

TABLE 17 generation of maximum boost voltage (Vd) when
INp = L and INn = H (ST1)

| FIG. | | FIG. 12A | FIG. 13A |
|---|---|---|---|
| upper conduction path | ILp OUTp | $ILp = (I_{C-1} + I_{C0} + I_{C+1})$<br>OUTp = Vdc_p + Vsw_p = Vdd*RLp/<br>(RTp1 + RLp) + ILp*(RTp1//RLp) | $ILp = (I_{C-1} - I_{C0} + I_{C+1})$ |
| lower conduction path | ILn OUTn | ILn = 0<br>OUTn = Vsw_n = 0 V | |

The upper conduction paths in FIGS. 12A and 13A are compared. The DC components Vdc_p of the positive output signals OUTp in FIGS. 12A and 13A are equivalent (that is, Vdc_p=Vdd*RLp/(RTp1+RLp)). Moreover, both the swing components Vsw_p of the positive output signals OUTp in FIGS. 12A and 13A can be represented by Vsw_p=ILp*(RTp1//RLp). Please note that the current values of the positive loading currents ILp in FIGS. 12A and 13A are different. The positive loading current ILp is equivalent to the summation of source currents $I_{C-1}$, $I_{C0}$, $I_{C+1}$ (that is, $ILp=I_{C-1}+I_{C0}+I_{C+1}$) in FIG. 12A, and the negative loading current ILp is equivalent to the summation of the sink current $I_{C0}$ and the source currents $I_{C-1}$, $I_{C+1}$ (that is, $ILp=I_{C-1}-I_{C0}+I_{C+1}$) in FIG. 13A.

The lower conduction paths in FIGS. 12A and 13A are compared. The swing components Vsw_n of the negative output signal OUTn in FIGS. 12A and 13A are equivalent to 0V because the negative loading current ILn is equivalent to 0 (ILn=0).

Please refer to FIGS. 12B and 13B together. FIGS. 12B and 13B represent that the current mode driver (cmDRV) is adjusted to make the physical driving module output the maximum boost voltage (Vd) when the voltage mode driver (vmDRV) operates in state two (ST2). The parameters in FIGS. 12B and 13B are listed and compared in Table 18.

TABLE 18 generation of maximum boost voltage (Vd) when
INp = H and INn = L (ST2)

| FIG. | | FIG. 12B | FIG. 13B |
|---|---|---|---|
| upper conduction path | ILp OUTp | ILp = 0<br>OUTn = Vsw_p = 0 V | |
| lower conduction path | ILn OUTn | $ILn = (I_{C-1} + I_{C0} + I_{C+1})$<br>OUTn = Vdc_n + Vsw_n = Vdd*RLn/<br>(RTp2 + RLn) + ILn*(RTp2//RLn) | $ILn = (I_{C-1} - I_{C0} + I_{C+1})$ |

The upper conduction paths in FIGS. 12B and 13B are compared. The swing components Vsw_n of the positive output signal OUTp in FIGS. 10B and 11B are equivalent to 0V because the positive loading current ILp is equivalent to 0 (ILp=0).

The lower conduction paths in FIGS. 12B and 13B are compared. The DC components Vdc_n of the negative output signal OUTn in FIGS. 12B and 13B are equivalent (that is, Vdc_n=Vdd*RLn/(RTp2+RLn)). Moreover, both the swing components Vsw_n of the negative output signal OUTn in FIGS. 12B and 13B can be represented as OUTn=ILn*(RTp2//RLn). Please note that the negative loading currents ILn in FIGS. 12B and 13B are different. The negative loading current ILn is equivalent to the summation of source currents $I_{C-1}$, $I_{C0}$, $I_{C+1}$ ($ILp=I_{C-1}-I_{C0}+I_{C+1}$) in FIG. 12B, and the negative loading current ILn is equivalent to the summation of the sink current $I_{C0}$ and the source currents $I_{C-1}$, $I_{C+1}$ ($ILp=I_{C-1}-I_{C0}+I_{C+1}$) in FIG. 13B.

Figure 14:
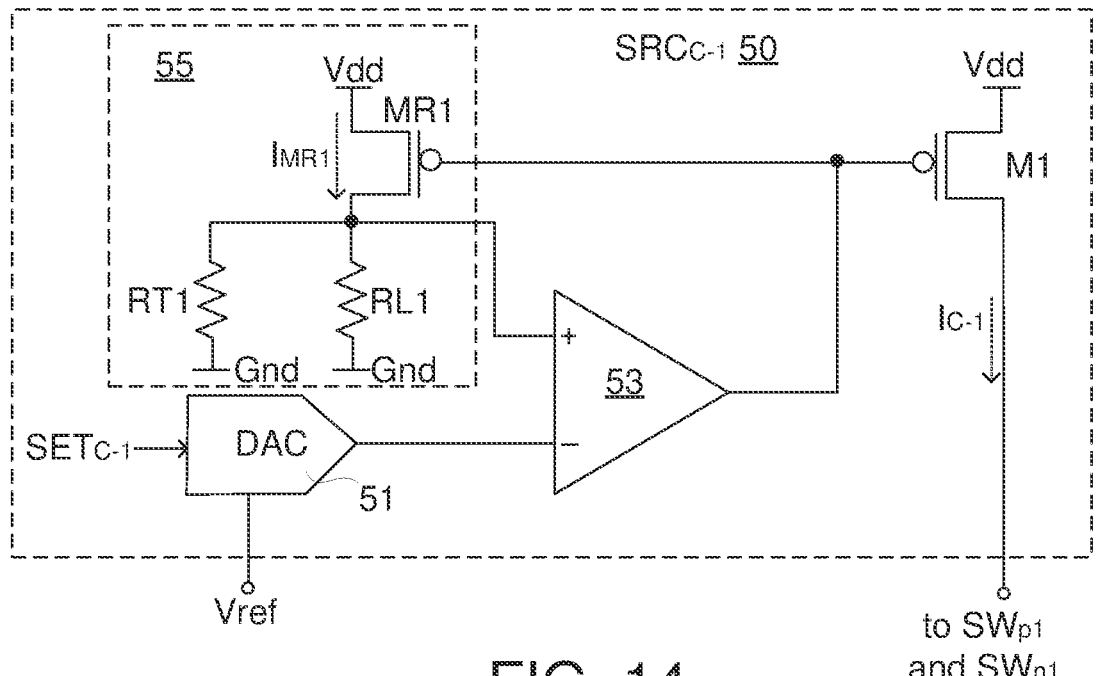
FIG. 14 is a schematic diagram illustrating an exemplary implementation of the current source $SRC_{C-1}$ for providing the source current $I_{C-1}$.

FIG. 14 is a schematic diagram illustrating an exemplary implementation of the current source $SRC_{C-1}$ for providing the source current $I_{C-1}$. The current source ($SRC_{C-1}$) 50 includes an error amplifier 53, a DAC 51, a PMOS transistor M1, and a voltage-to-current converting circuit 55. Based on the reference voltage Vref and the current setting signal $SET_{C-1}$, the DAC 71 generates an analog setting voltage at the inverting terminal (−) of the error amplifier 73. The analog setting voltage represents the tap coefficient being set by the current setting signal $SET_{C-1}$.

The voltage-to-current converting circuit 55 includes a PMOS transistor MR1, a driving replica resistor RT1, and a loading replica resistor RL1. The driving replica resistor RT1 is electrically connected to the non-inverting input terminal (−) of the error amplifier 53 and the ground terminal Gnd. The resistance of driving replica resistor RT1 is equivalent to the resistances of pull-up resistors RTp1, RTp2, and pull-down resistors RTn1, RTn2. The loading replica resistor RL1 is electrically connected to the non-inverting input terminal (+) of the error amplifier 53 and the ground terminal Gnd. The resistance of the loading replica resistor RL1 is equivalent to the resistances of positive loading resistor RLp and negative loading resistor RLn.

The source terminals of the PMOS transistors M1, MR1 are electrically connected to the supply voltage terminal Vdd, and the gate terminals of the PMOS transistors M1, MR1 are electrically connected to the output terminal of the error amplifier 53. The drain terminal of the PMOS transistor M1 is electrically connected to the switches $SW_{p1}$, $SW_{n1}$.

The PMOS transistors M1, MR1 form a current mirror, and the reference mirror current $I_{MR1}$ flowing through the PMOS transistor MR1 is replicated to generate the source current $I_{C-1}$ flowing through the PMOS transistor M1. The reference mirror current $I_{MR1}$ is changed with the signal at the non-inverting input terminal (+) of the error amplifier 53. Based on the virtual ground feature of the error amplifier 53, the signal at the non-inverting input terminal (+) should be an equivalent signal at the inverting input terminal (−) of the error amplifier 53.

As the inverting terminal (−) of the error amplifier 53 receives the analog setting voltage from the DAC 51 and the analog setting voltage represents the tap coefficient being set by the current setting signal $SET_{C+1}$, the signal at the non-inverting terminal (+) of the error amplifier 53 is changed with the current setting signal $SET_{C+1}$. Once the signal at the inverting terminal (−) of the error amplifier 53 is changed, the inverting terminal (−) of the error amplifier 53, the reference mirror current $I_{MR1}$, and the source current $I_{C-1}$ are changed accordingly.

As illustrated above, the switches $SW_{p1}$, $SW_{n1}$ are alternately switched on. Thus, the PMOS transistor M1 conducts the source current $I_{C-1}$ from the supply voltage terminal Vdd to the positive output terminal OUTp when the switch $SW_{p1}$ is switched on, or to the negative output terminal OUTn when the switch $SW_{n1}$ is switched on.

Figure 15A:
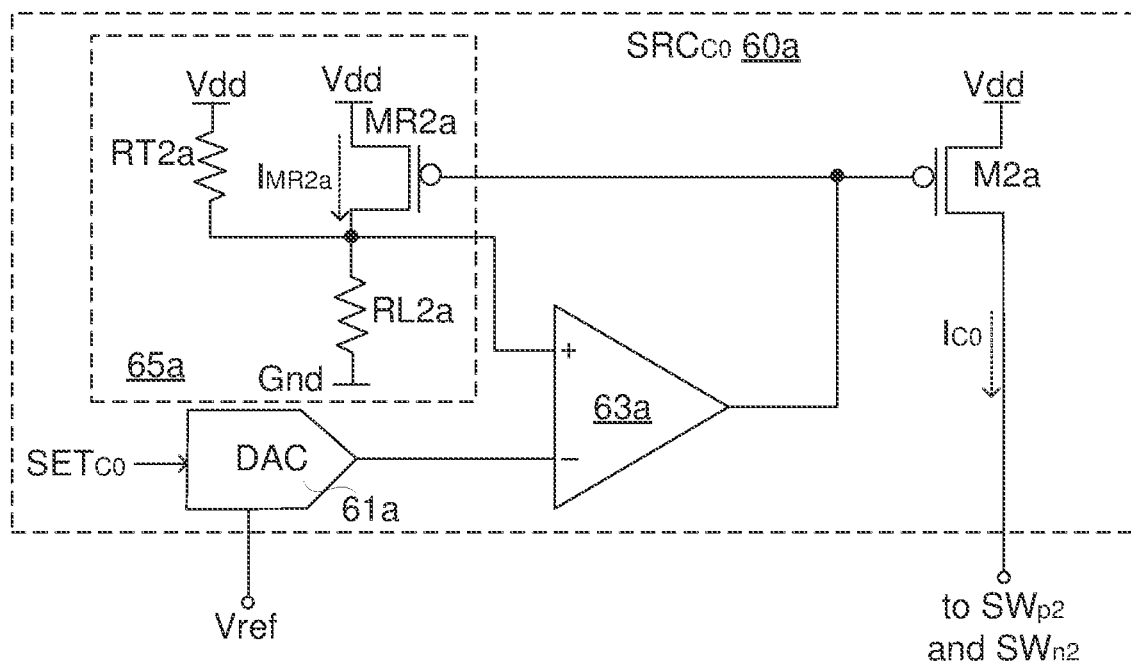
FIG. 15A is a schematic diagram illustrating an exemplary implementation of the current source $SRC_{C0}$ for providing the source current $I_{C0}$.

FIG. 15A is a schematic diagram illustrating an exemplary implementation of the current source $SRC_{C0}$ for providing the source current $I_{C0}$. The current source ($SRC_{C0}$) 60a includes an error amplifier 63a, a DAC 61a, a PMOS transistor M2a, and a voltage-to-current converting circuit 65a. The voltage-to-current converting circuit 65a includes a PMOS transistor MR2a, a driving replica resistor RT2a, and a loading replica resistor RL2a.

A reference mirror current $I_{MR2a}$ flowing through the PMOS transistor MR2a is indirectly set by the current setting signal $SET_{C0}$ and replicated to generate the source current $I_{C0}$ flowing through the PMOS transistor M2a. Then, the source current $I_{C-1}$ is conducted from the supply voltage terminal Vdd to the positive output terminal OUTp when the switch $SW_{p2}$ is switched on, or to the negative output terminal OUTn when the switch $SW_{n2}$ is switched on. As the current sources ($SRC_{C1}$) 50, ($SRC_{C0}$) 60a in FIGS. 14 and 15A have similar layouts. Detailed descriptions about internal connections and operations of the current source ($SRC_{C0}$) 60a are omitted.

Figure 15B:
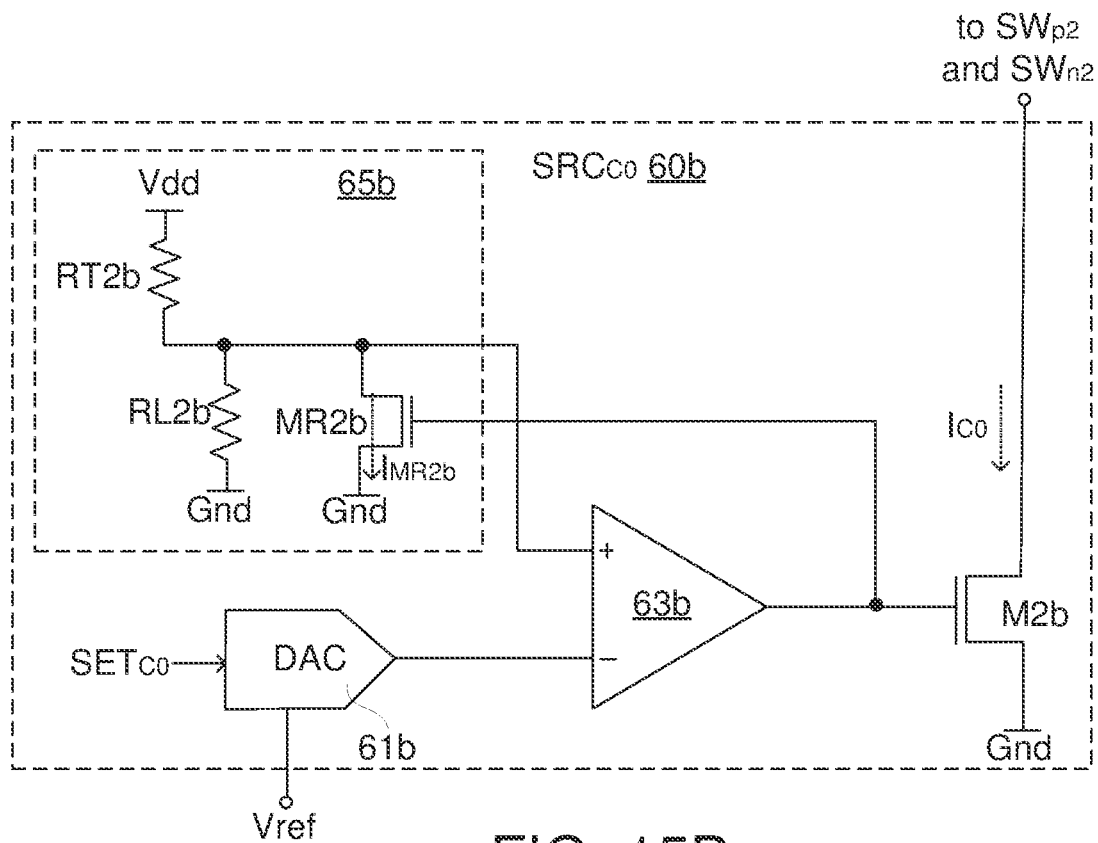
FIG. 15B is a schematic diagram illustrating an exemplary implementation of the current source $SRC_{C0}$ for providing the sink current $I_{C0}$.

FIG. 15B is a schematic diagram illustrating an exemplary implementation of the current source $SRC_{C0}$ for providing the sink current $I_{C0}$. The current source ($SRC_{C0}$) 60b includes an error amplifier 63b, a DAC 61b, an NMOS transistor M2b, and a voltage-to-current converting circuit 65b. Based on the reference voltage Vref and the current setting signal $SET_{C0}$, the DAC 61b generates an analog setting voltage at the inverting terminal (−) of the error amplifier 63b.

The voltage-to-current converting circuit 65b includes an NMOS transistor MR2b, a driving replica resistor RT2b, and a loading replica resistor RL2b. The driving replica resistor RT2b is electrically connected to the non-inverting input terminal (+) of the error amplifier 63b and the supply voltage terminal Vdd. The resistance of driving replica resistor RT2b is equivalent to the resistances of pull-up resistors RTp1, RTp2, and pull-down resistors RTn1, RTn2. The loading replica resistor RL2b is electrically connected to the non-inverting input terminal (−) of the error amplifier 63b and the supply voltage terminal Vdd. The resistance of the loading replica resistor RL2b is equivalent to the resistances of positive loading resistor RLp and negative loading resistor RLn. The source terminals of the NMOS transistors M2b, MR2b are electrically connected to the ground terminal Gnd, and the gate terminals of the NMOS transistors M2b, MR2b are electrically connected to the output terminal of the error amplifier 63b. The drain terminal of the NMOS transistor M2b is electrically connected to the switches $SW_{p2}$, $SW_{n2}$.

The NMOS transistors M2b, MR2b form a current mirror, and the reference mirror current $I_{MR2b}$ flowing through the NMOS transistor MR2b is replicated to generate the sink current $I_{C0}$ flowing through the NMOS transistor M2b. The reference mirror current $I_{MR2b}$ is changed with the signal at the non-inverting input terminal (+) of the error amplifier 63b. Based on the virtual ground feature of the error amplifier 63b, the signal at its non-inverting input terminal (+) should be equivalent to the signal at its inverting input terminal (−).

As the inverting terminal (−) of the error amplifier 63b receives the analog setting voltage from the DAC 61b, and the analog setting voltage represents the tap coefficient being set by the current setting signal $SET_{C0}$, the signal at the non-inverting terminal (+) of the error amplifier 63b is changed with the current setting signal $SET_{C0}$. Once the signal at the inverting terminal (−) of the error amplifier 63b is changed, the inverting terminal (−) of the error amplifier 63b, the reference mirror current $I_{MR2b}$, and the sink current $I_{C0}$ are changed accordingly.

As illustrated above, the switches $SW_{p2}$, $SW_{n2}$ are alternately switched on. Thus, the NMOS transistor M2b conducts the source current $I_{C0}$ from the positive output terminal OUTp to the ground terminal Gnd when the switch $SW_{p2}$ is switched on, or conducts the source current $I_{C0}$ from the negative output terminal OUTn to the ground terminal Gnd when the switch $SW_{n2}$ is switched on.

Figure 16:
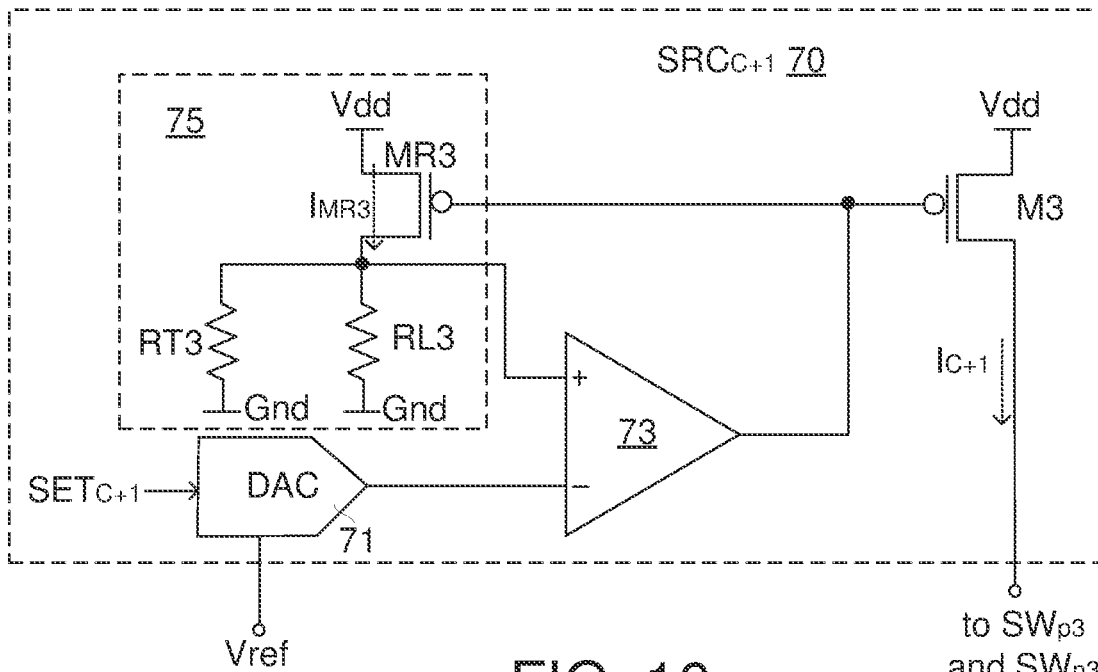
FIG. 16 is a schematic diagram illustrating an exemplary implementation of the current source $SRC_{C+1}$ for providing the source current $I_{C+1}$.

FIG. 16 is a schematic diagram illustrating an exemplary implementation of the current source $SRC_{C+1}$ for providing the source current $I_{C+1}$. The current source ($SRC_{C+1}$) 70 includes an error amplifier 73, a DAC 71, a PMOS transistor M3, and a voltage-to-current converting circuit 75. The voltage-to-current converting circuit 75 includes a PMOS transistor MR3, a driving replica resistor RT3, and a loading replica resistor RL3.

A reference mirror current $I_{MR3}$ flowing through the PMOS transistor MR3 is indirectly set by the current setting signal $SET_{C+1}$ and replicated to generate the source current $I_{C+1}$ flowing through the PMOS transistor M3. Then, the source current $I_{C+1}$ is conducted from the supply voltage terminal Vdd to the positive output terminal OUTp when the switch $SW_{p3}$ is switched on, or to the negative output terminal OUTn when the switch $SW_{n3}$ is switched on. The current sources ($SRC_{C1}$) 50, ($SRC_{C+1}$) 70 in FIGS. 14 and 16 have similar layouts, and detailed descriptions about internal connections and operations of the current source ($SRC_{C+1}$) 70 are omitted.

Embodiments of a physical driving module equipped with a 3-tap FFE have been illustrated above. The physical driving module, with a two-stage design (the voltage mode driver vmDRV and the current mode driver cmDRV), drives the positive input signal INp and the negative input signal INn to generate the positive output signal OUTp and the negative output signal OUTn. The positive output signal OUTp and the negative output signal OUTn jointly form the transmission signal.

In the first stage, the voltage mode driver (vmDRV) 2331 can operate at high speed as it has low power consumption. In the second stage, the current mode driver (cmDRV) 2333a, 2333b injects adequate positive loading current ILp and negative loading current ILn to the loading circuit (ldCKT) 25. With the current mode driver (cmDRV) 2333a, 2333b, the output impedance of the physical driving module 23a, 23b can retain consistent, a higher voltage swing (higher than Vdd/2) can be achieved, and settings of the current sources $SRC_{C-1}$, $SRC_{C0}$, $SRC_{C+1}$ in the current mode driver (cmDRV) 2333a, 2333b representing tap coefficients $C_{-1}$, $C_0$, $C_{+1}$ can be relatively easily programmed. With the two-stage layout, the physical driving module can be applied to high-speed SERDES applications such as PCIe, USB, DDR, and so forth.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A driving module comprising:
a voltage mode driver, electrically connected to a positive output terminal and a negative output terminal, configured to convert a positive input signal to a positive output signal at the positive output terminal, and convert a negative input signal to a negative output signal at the negative output terminal, wherein the positive input signal and the negative input signal are differential signals; and
a current mode driver, electrically connected to the voltage mode driver, comprising:
a first current source, configured to provide a first current to one of the positive output terminal and the negative output terminal;
a second current source, configured to provide a second current to one of the positive output terminal and the negative output terminal;
a third current source, configured to provide a third current to one of the positive output terminal and the negative output terminal; and
a feed-forward equalizer, electrically connected to a media access controller and the current mode driver, configured to receive a physical control signal from the media access controller and perform a pre-emphasis equalization accordingly, wherein the media access controller generates the physical control signal based on a sequence of input bits.

2. The driving module according to claim 1, wherein the driving module is electrically connected to a loading circuit, and the loading circuit comprises:
a positive loading resistor, electrically connected to the positive output terminal and a ground terminal; and
a negative loading resistor, electrically connected to the negative output terminal and the ground terminal,
wherein a positive loading current flows through the positive loading resistor, and a negative loading current flows through the negative loading resistor.

3. The driving module according to claim 2, wherein voltage mode driver comprises:
a first voltage driving path, electrically connected to the positive output terminal, configured to conduct one of a supply voltage and a ground voltage to the positive output terminal in response to the positive input signal; and
a second voltage driving path, electrically connected to the negative output terminal, configured to conduct the other one of the supply voltage and the ground voltage to the negative output terminal in response to the negative input signal.

4. The driving module according to claim 3, wherein when the positive input signal has a negative voltage, and the negative input signal has a positive voltage, the first voltage driving path conducts the supply voltage to the positive output terminal, and the second voltage driving path conducts the ground voltage to the negative output terminal.

5. The driving module according to claim 4, wherein the positive output signal comprises a direct current component and a swing component, and the negative output signal comprises a swing component, wherein the swing component of the positive output signal is changed with the positive loading current, and the swing component of the negative output signal is changed with the negative loading current.

6. The driving module according to claim 4, wherein positive output signal and the negative output signal collectively form a de-emphasis voltage when the positive loading current is set by the first current and the second current, and the negative loading current is set by the third current.

7. The driving module according to claim 4, wherein the positive output signal and the negative output signal collectively form a flat level voltage when the positive loading current is set by the first current and the third current, and the negative loading current is set by the second current.

8. The driving module according to claim 4, wherein the positive output signal and the negative output signal collectively form a pre-shoot voltage when the positive loading current is set by the second current and the third current, and the negative loading current is set by the first current.

9. The driving module according to claim 4, wherein the positive output signal and the negative output signal collectively form a maximum boost voltage when the positive loading current is set by the first current, the second current, and the third current and the negative loading current is equivalent to 0.

10. The driving module according to claim 3, wherein
when the positive input signal has the positive voltage, and the negative input signal has the negative voltage, the first voltage driving path conducts the ground voltage to the positive output terminal, and the second voltage driving path conducts the supply voltage to the negative output terminal.

11. The driving module according to claim 10, wherein
the positive output signal comprises a swing component, and the negative output signal comprises a direct current component and a swing component, wherein the swing component of the positive output signal is changed with the positive loading current, and the swing component of the negative output signal is changed with the negative loading current.

12. The driving module according to claim 10, wherein the positive output signal and the negative output signal collectively form a de-emphasis voltage when the positive loading current is set by the third current, and the negative loading current is set by the first current and the second current.

13. The driving module according to claim 10, wherein the positive output signal and the negative output signal collectively form a flat-level voltage when the positive loading current is set by the second current, and the negative loading current is set by the first current and the third current.

14. The driving module according to claim 10, wherein the positive output signal and the negative output signal collectively form a pre-shoot voltage when the positive loading current is set by the first current, and the negative loading current is set by the second current and the third current.

15. The driving module according to claim 10, wherein the positive output signal and the negative output signal collectively form a maximum boost voltage when the positive loading current is equivalent to 0, and the negative loading current is set by the first current, the second current, and the third current.

16. The driving module according to claim 1, wherein the first current source, the second current source, and the third current source are electrically connected to a supply voltage terminal.

17. The driving module according to claim 1, wherein the first current source and the third current source are electrically connected to a supply voltage terminal, and the second current source is electrically connected to a ground terminal.

18. The driving module according to claim 1, wherein the current mode driver further comprises:
- a first-first switch, electrically connected to the first current source and the positive output terminal;
- a second-first switch, electrically connected to the first current source and the negative output terminal, wherein the first-first switch and the second-first switch are alternately switched on;
- a first-second switch, electrically connected to the second current source and the positive output terminal;
- a second-second switch, electrically connected to the second current source and the negative output terminal, wherein the first-second switch and the second-second switch are alternately switched on;
- a first-third switch, electrically connected to the third current source and the positive output terminal; and
- a second-third switch, electrically connected to the third current source and the negative output terminal, wherein the first-third switch and the second-third switch are alternately switched on.

19. The driving module according to claim 18, wherein the feed-forward equalizer performs the pre-emphasis equalization by
- adjusting current values of the first current, the second current, and the third current, and
- switching the first-first switch, the second-first switch, the first-second switch, the second-second switch, the first-third switch, and the second-third switch.

* * * * *